(12) United States Patent
Nishitani et al.

(10) Patent No.: US 11,027,428 B2
(45) Date of Patent: Jun. 8, 2021

(54) SIMULATION APPARATUS AND ROBOT CONTROL APPARATUS

(71) Applicant: Seiko Epson Corporation, Tokyo (JP)

(72) Inventors: Masanobu Nishitani, Suwa (JP); Tsutomu Hagihara, Hara-mura (JP)

(73) Assignee: Seiko Epson Corporation

( * ) Notice: Subject to any disclaimer, the term of this patent is extended or adjusted under 35 U.S.C. 154(b) by 333 days.

(21) Appl. No.: 15/951,442

(22) Filed: Apr. 12, 2018

(65) Prior Publication Data

US 2018/0297202 A1 Oct. 18, 2018

(30) Foreign Application Priority Data

Apr. 14, 2017 (JP) .............................. JP2017-080734

(51) Int. Cl.
| | | |
|---|---|---|
| *G06F 19/00* | (2018.01) | |
| *B25J 9/16* | (2006.01) | |
| *G06F 3/0486* | (2013.01) | |
| *G06F 30/20* | (2020.01) | |

(52) U.S. Cl.
CPC .......... *B25J 9/1671* (2013.01); *G06F 3/0486* (2013.01); *G06F 30/20* (2020.01)

(58) Field of Classification Search
CPC ........ B25J 9/1671; G06F 30/20; G06F 3/0486
See application file for complete search history.

(56) References Cited

U.S. PATENT DOCUMENTS

| | | | |
|---|---|---|---|
| 6,088,628 A | 7/2000 | Watanabe et al. | |
| 2007/0282485 A1* | 12/2007 | Nagatsuka ............. | B25J 9/1671 700/245 |
| 2014/0236565 A1* | 8/2014 | Kuwahara ............. | B25J 9/1671 703/22 |
| 2015/0261899 A1* | 9/2015 | Atohira ................... | G06F 30/20 703/7 |
| 2016/0332297 A1* | 11/2016 | Sugaya ............... | G06F 3/04842 |
| 2016/0368142 A1 | 12/2016 | Matsunami et al. | |
| 2017/0274532 A1 | 9/2017 | Nishitani et al. | |
| 2019/0126475 A1* | 5/2019 | Kawanishi ............. | B25J 9/1666 |

FOREIGN PATENT DOCUMENTS

| | | |
|---|---|---|
| JP | H09-103978 A | 4/1997 |
| JP | 10-177409 A | 6/1998 |
| JP | 2006-190228 A | 7/2006 |
| JP | 2010-240816 A | 10/2010 |
| JP | 2014-161921 A | 9/2014 |
| JP | 2015-174184 A | 10/2015 |
| JP | 2016-175143 A | 10/2016 |
| JP | 2017-177283 A | 10/2017 |
| WO | 1998-003314 A1 | 1/1998 |

* cited by examiner

*Primary Examiner* — Harry Y Oh
*Assistant Examiner* — Sohana Tanju Khayer
(74) *Attorney, Agent, or Firm* — Harness, Dickey & Pierce, P.L.C.

(57) ABSTRACT

A simulation apparatus that allows a virtual robot arm displayed on a display device to act, includes a processor that is configured to execute computer-executable instructions so as to control a robot, wherein the processor is configured to receive drag operation on a distal end of the virtual robot arm from an input device, and change an attitude of the virtual robot arm based on the drag operation.

16 Claims, 21 Drawing Sheets

SIMULATION APPARATUS AND ROBOT CONTROL APPARATUS

BACKGROUND

1. Technical Field

The present invention relates to a simulation apparatus, and a robot control apparatus.

2. Related Art

Robots with robot arms each having a base and a plurality of arms (links) are known. One arm of the adjacent two arms of the robot arm is rotatably coupled to the other arm via a joint part, and the arm on the most proximal end side (on the most upstream side) is rotatably coupled to the base via a joint part. The joint parts are driven by motors and the arms rotate by driving of the joint parts. Further, as an end effector, e.g. a hand is detachably attached to the arm on the most distal end side (on the most downstream side). For example, the robot grasps an object with the hand, moves the object to a predetermined location, and performs predetermined work such as assembly. In the robot, it is necessary to teach the robot before actual work.

Patent Document 1 (JP-A-2014-161921) discloses a robot simulator that can teach a robot offline. In the robot simulator, a virtual robot and a virtual operating handle used for operating the robot are displayed on a display device.

The operating handle is represented by xyz coordinate axes (three-dimensional coordinate axes) with a predetermined control point (e.g. the distal end of the robot arm) set in the robot as the origin. The operating handle is operated via an operation unit of the robot simulator, and thereby, the control point of the robot may be moved respectively along the x-axis, y-axis, z-axis and rotated respectively about the x-axis, y-axis, z-axis.

A user may create teaching data without action of the robot using the robot simulator.

However, in the robot simulator described in Patent Document 1, the attitude of the robot is changed by operation of the operating handle represented by the xyz coordinate axes, and thus, with respect to the six directions along the x-axis, y-axis, z-axis and about the x-axis, y-axis, z-axis, individual operation is necessary in the respective directions. Accordingly, the attitude change of the robot takes time and effort.

SUMMARY

An advantage of some aspects of the invention is to solve at least a part of the problems described above, and can be implemented as the following forms or application examples.

A simulation apparatus according to an aspect of the invention is a simulation apparatus that allows a virtual robot arm displayed on a display device to act, including a receiving unit that receives drag operation on a distal end of the virtual robot arm from an input device, and a display control unit that changes an attitude of the virtual robot arm based on the drag operation received by the receiving unit.

With this configuration, the drag operation on the distal end of the virtual robot arm is performed and the attitude of the virtual robot arm is changed according to the drag operation. Thus, the attitude of the virtual robot arm may be changed easily and promptly and, as a result, teaching data of the robot arm (robot) may be created offline easily and promptly. That is, teaching, specifically, rough teaching may be performed on the robot arm (robot) offline easily and promptly.

In the simulation apparatus according to the aspect of the invention, it is preferable that the virtual robot arm has a plurality of virtual arms, and an attitude of at least one virtual arm of the plurality of virtual arms is changeable by the drag operation.

With this configuration, the attitudes of the plurality of virtual arms may be individually changed and teaching data may be created, and the attitude of the virtual robot arm may be easily changed to a target attitude.

In the simulation apparatus according to the aspect of the invention, it is preferable that, when the receiving unit receives an instruction to fix a position of the distal end of the virtual robot arm, the attitude of the virtual robot arm is changeable with the position of the distal end of the virtual robot arm fixed.

With this configuration, the attitude of the virtual robot arm may be changed easily and promptly with the position of the distal end of the virtual robot arm fixed. The function may be used, for example, in the cases where avoidance of interferences between the robot arm and peripherals is desired, where the change of only the attitude of the robot arm grasping a predetermined object without moving the object is desired, etc. during actual work.

In the simulation apparatus according to the aspect of the invention, it is preferable that, when the attitude of the virtual robot arm is an impossible attitude of the virtual robot arm by the drag operation, a display form of the display device is changed.

With this configuration, the situation that the attitude of the virtual robot arm is an impossible attitude of the virtual robot arm may be recognized easily and precisely.

In the simulation apparatus according to the aspect of the invention, it is preferable that, when the receiving unit receives an operation on a virtual object, a position on the virtual object can be set as a taught point of the virtual robot arm.

With this configuration, teaching data with the taught point in the position on the virtual object may be created easily and promptly.

In the simulation apparatus according to the aspect of the invention, it is preferable that, when the receiving unit receives a selection of a line segment contained in the virtual object, a center of gravity of a figure containing the line segment can be set as a taught point of the virtual robot arm.

With this configuration, teaching data with the taught point in the position of the center of gravity of the figure containing the line segment contained in the virtual object may be created easily and promptly.

In the simulation apparatus according to the aspect of the invention, it is preferable that, when the line segment is an arc, a center of the arc can be set as a taught point of the virtual robot arm.

With this configuration, teaching data with the taught point in the position of the center of the arc contained in the virtual object may be created easily and promptly. Thus, for example, teaching data of work including actions to align mutual center axes such as screw fastening, screw fastening at multiple points, and application and injection of grease may be created easily and promptly.

In the simulation apparatus according to the aspect of the invention, it is preferable that the display control unit allows the display device to display a taught point setting window used when the position of the distal end of the virtual robot arm is taught on a screen on which the virtual robot arm is displayed.

With this configuration, compared to the case where work is performed while alternating between two windows in related art, the convenience is higher and work efficiency may be improved.

In the simulation apparatus according to the aspect of the invention, it is preferable that the display device includes the input device.

With this configuration, it is not necessary to prepare the input device separately from the display device and the convenience is higher.

A robot control apparatus according to an aspect of the invention controls a robot including a robot arm based on a simulation result of the simulation apparatus according to the aspect of the invention.

With this configuration, teaching may be performed on the robot arm (robot) offline easily and promptly, and the robot may be allowed to precisely act based on the obtained teaching data.

A robot according to an aspect of the invention includes a robot arm and is controlled by the robot control apparatus according to the aspect of the invention.

With this configuration, teaching may be performed on the robot arm (robot) offline easily and promptly, and the robot may precisely act based on the obtained teaching data.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, a simulation apparatus, a robot control apparatus, and a robot according to the invention will be explained in detail based on embodiments shown in the accompanying drawings.

First Embodiment

Figure 1:
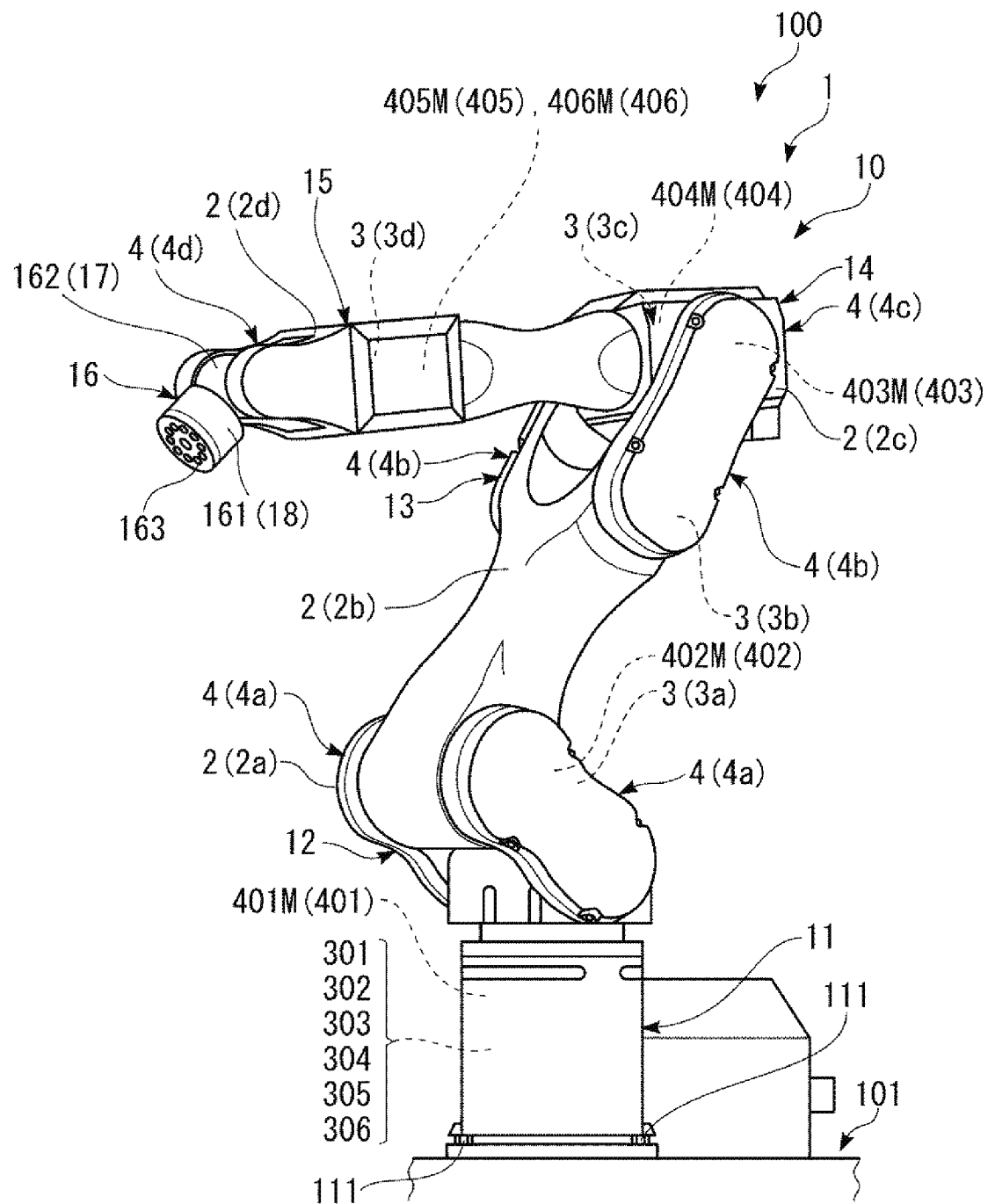
FIG. 1 is a perspective view showing an embodiment of a robot according to the invention.
Figure 2:
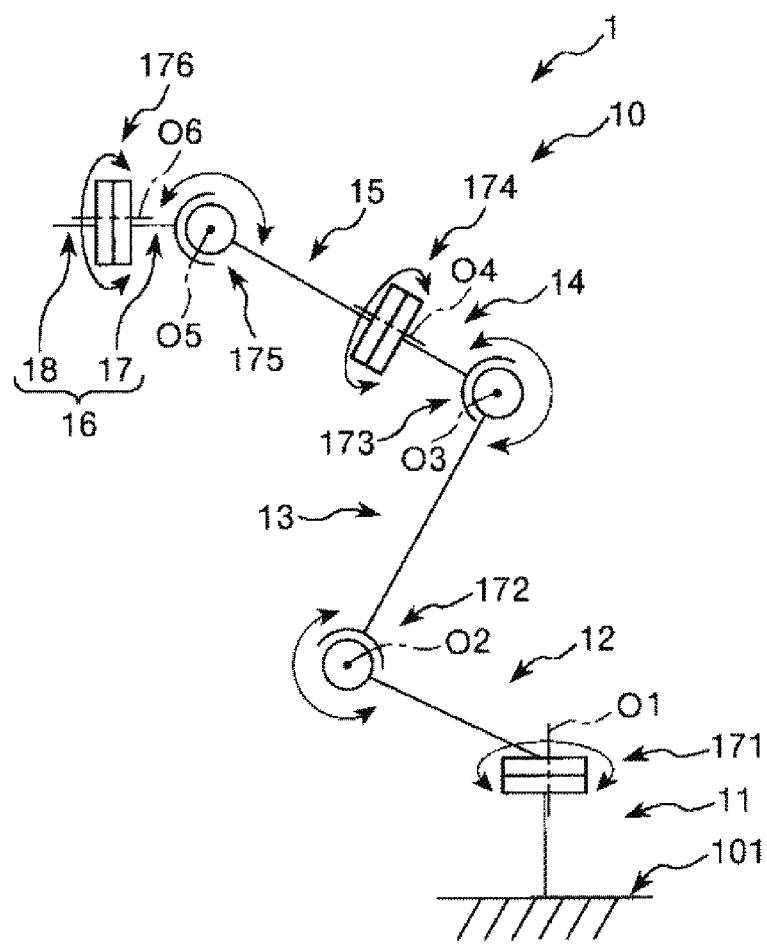
FIG. 2 is a schematic diagram of the robot shown in FIG. 1.
Figure 3:
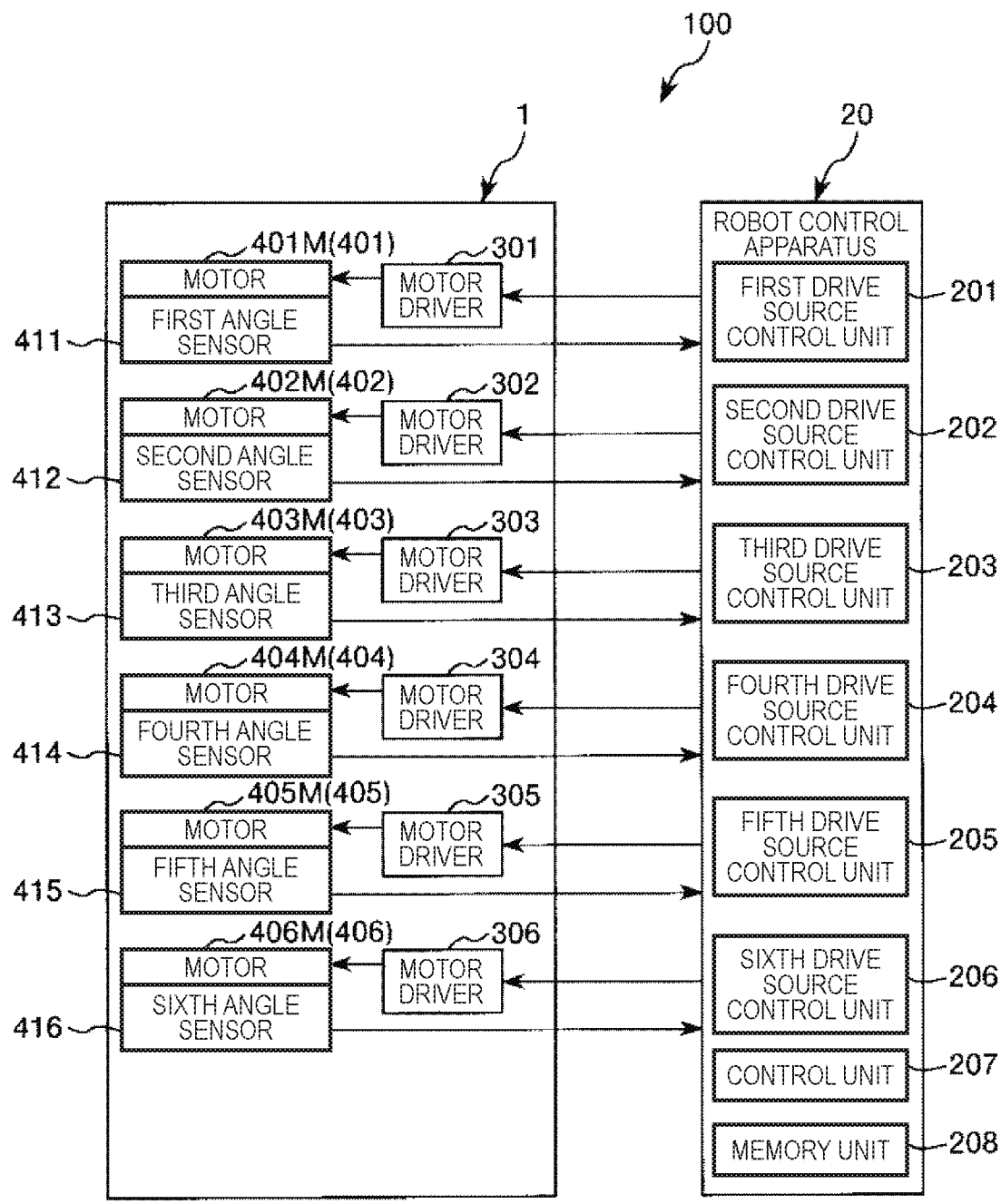
FIG. 3 is a block diagram of a main part of embodiments of the robot and a robot control apparatus according to the invention.
Figure 4:
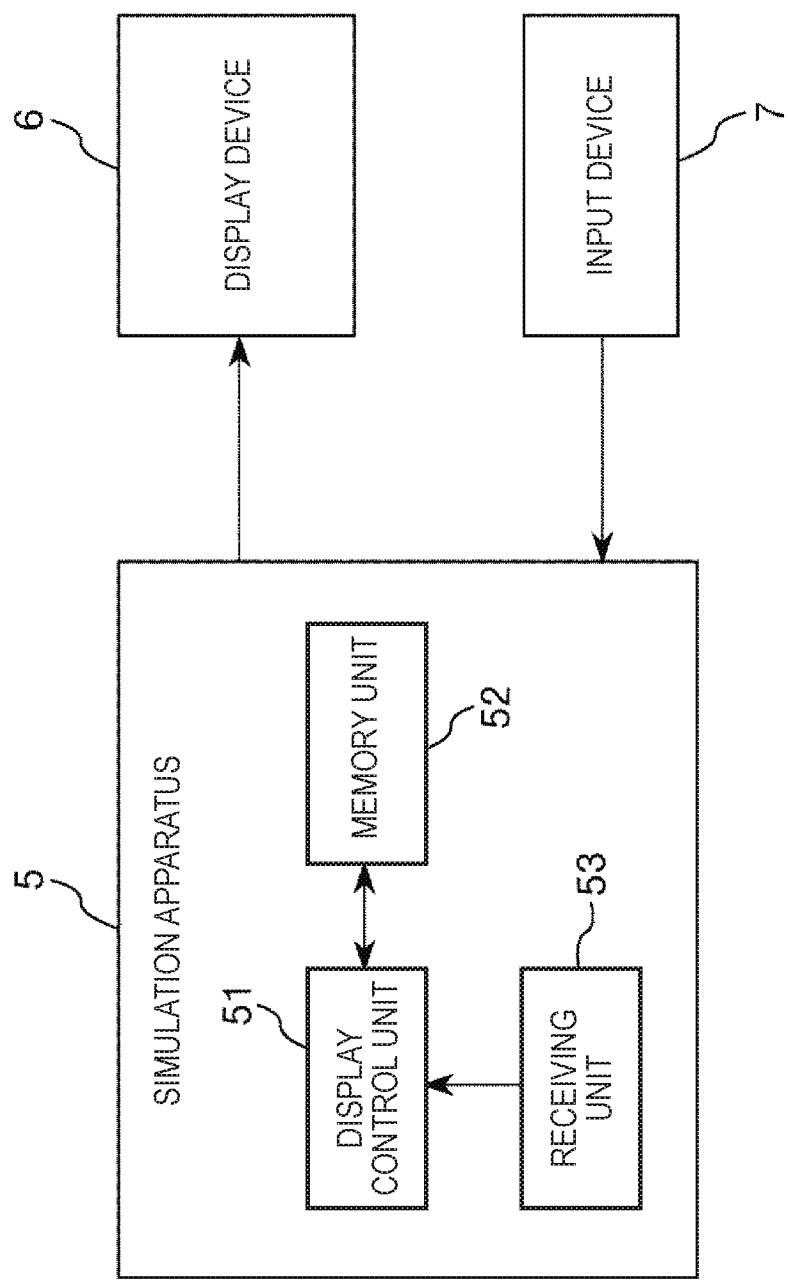
FIG. 4 is a block diagram showing the first embodiment of a simulation apparatus according to the invention.
Figure 5:
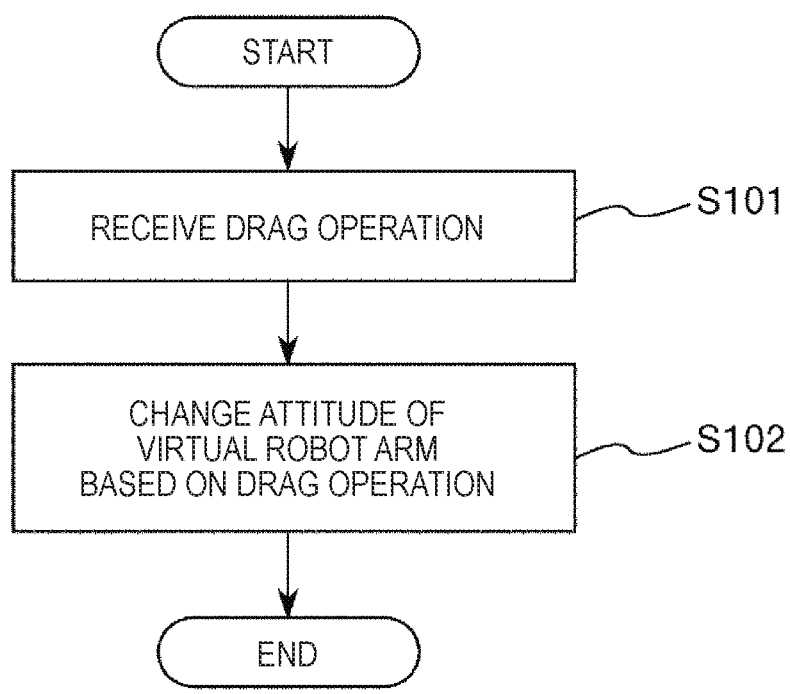
FIG. 5 is a flowchart showing control actions of the simulation apparatus shown in FIG. 4.
Figure 11:
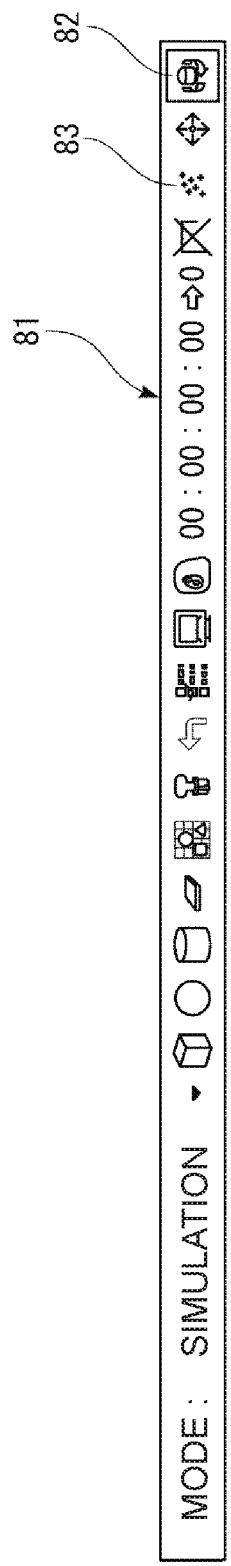
FIG. 11 shows a toolbar displayed on a display device.
Figure 12:
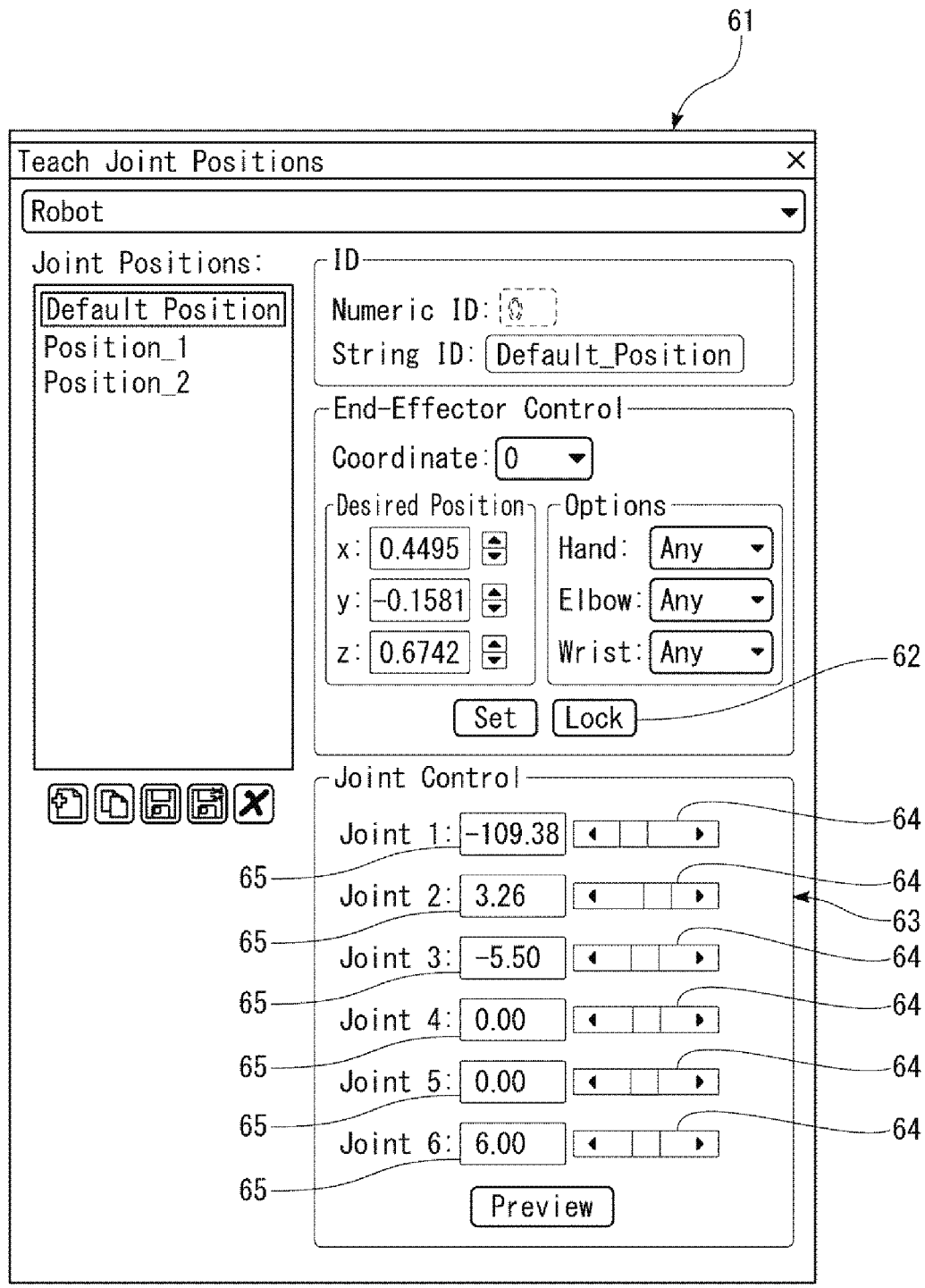
FIG. 12 shows Teach Joint Positions displayed on the display device.
Figure 13:
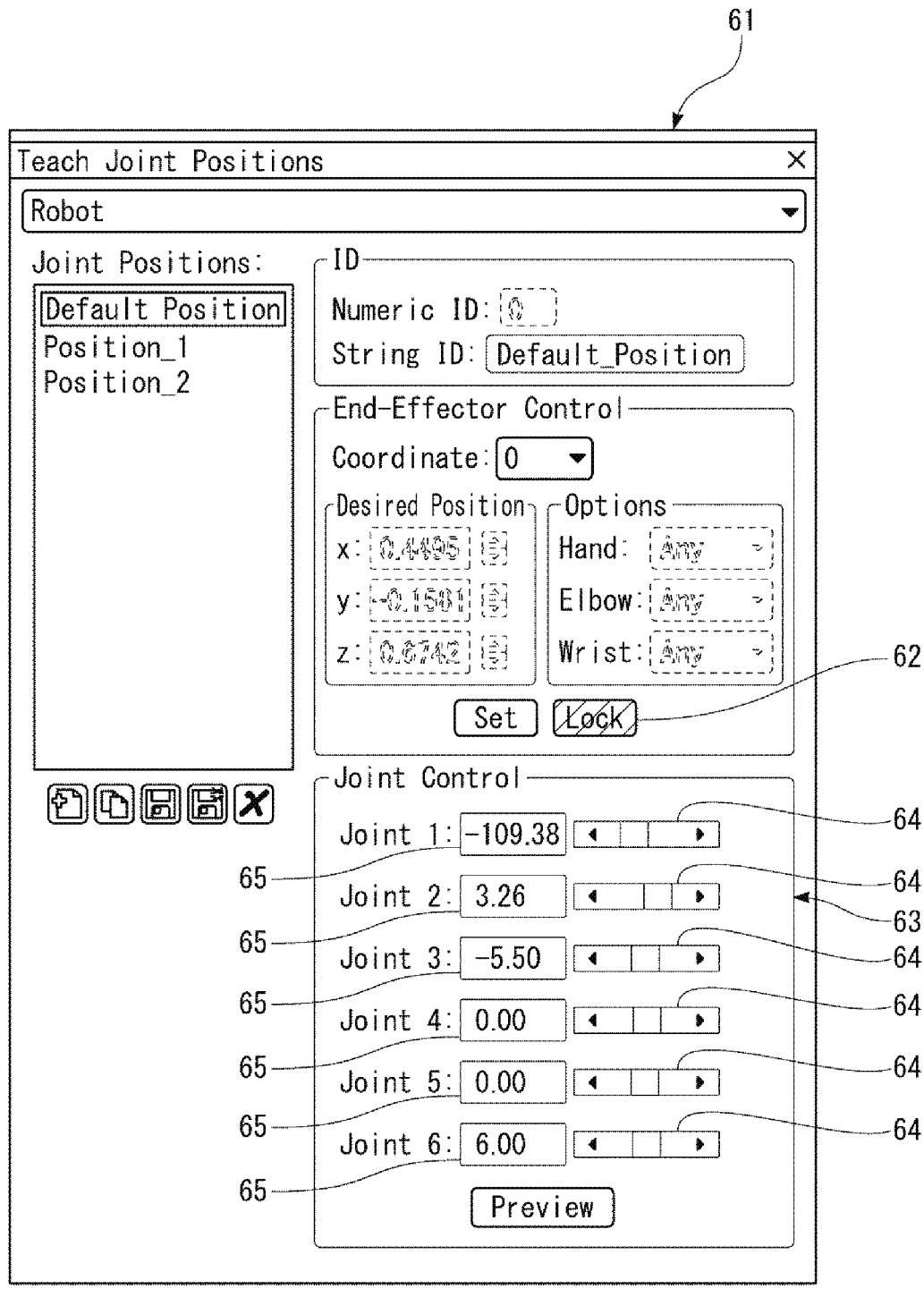
FIG. 13 shows Teach Joint Positions displayed on the display device.
Figure 14:
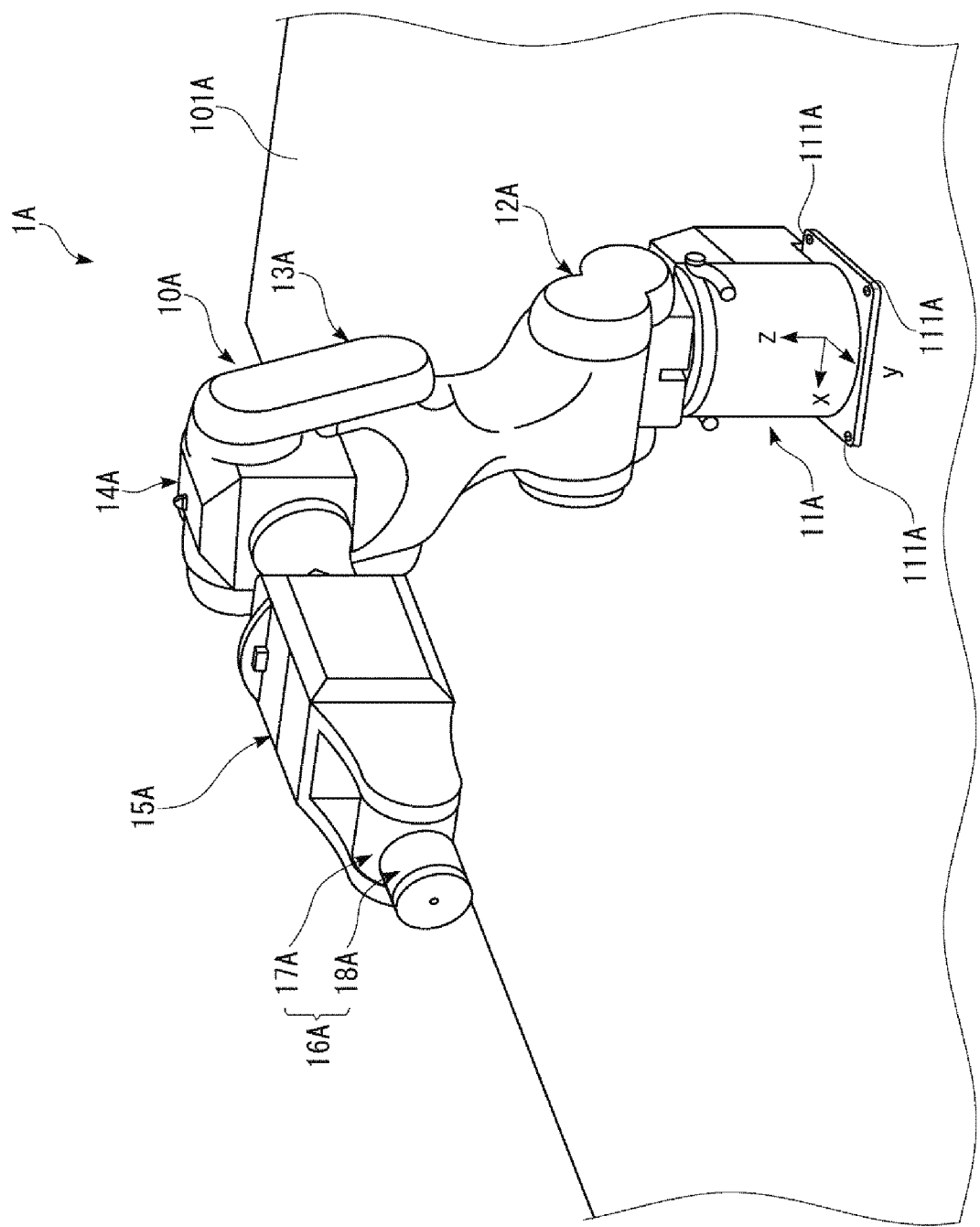
FIG. 14 is a diagram for explanation of a simulation of the simulation apparatus shown in FIG. 4.
Figure 15:
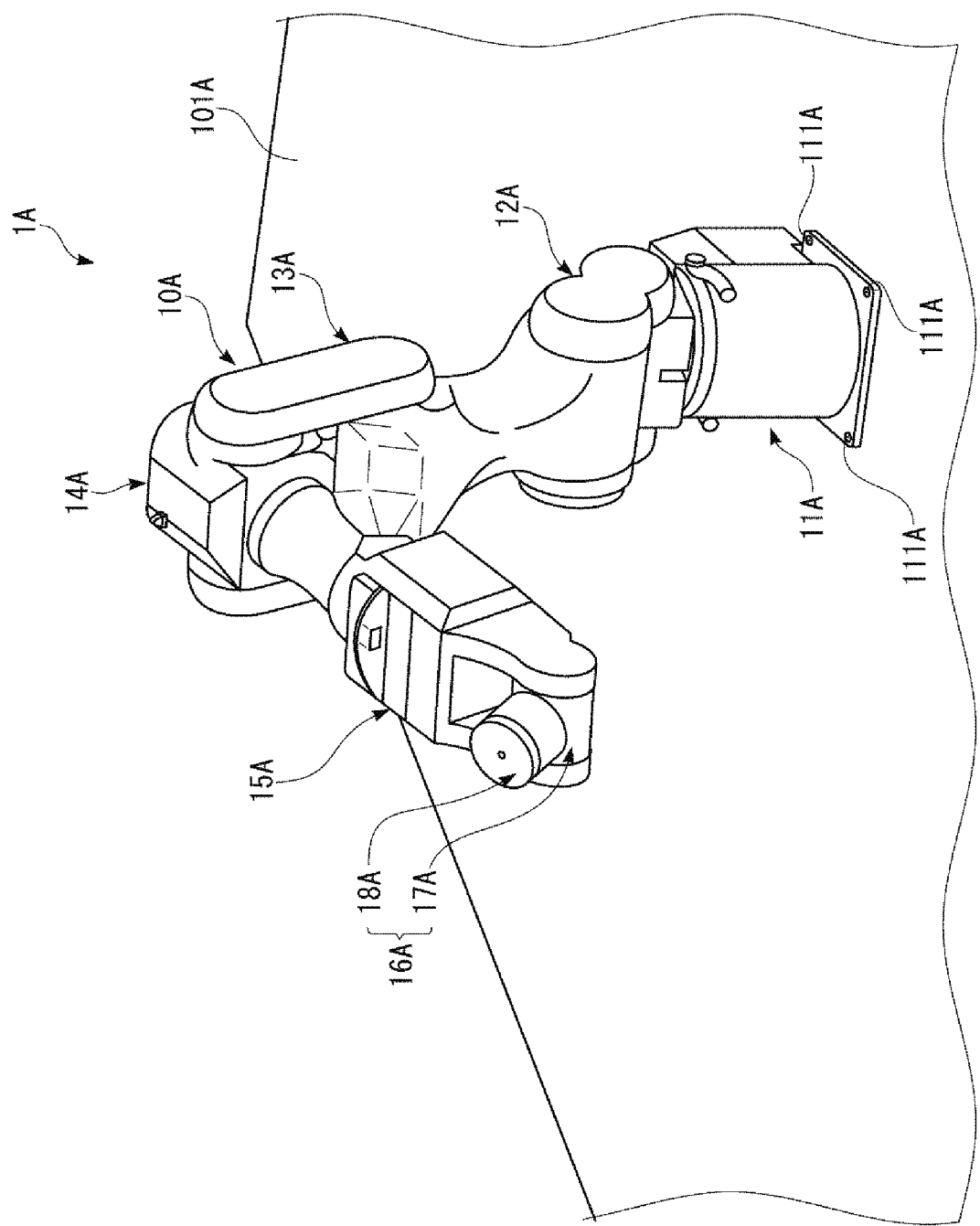
FIG. 15 is a diagram for explanation of the simulation of the simulation apparatus shown in FIG. 4.
Figure 16:
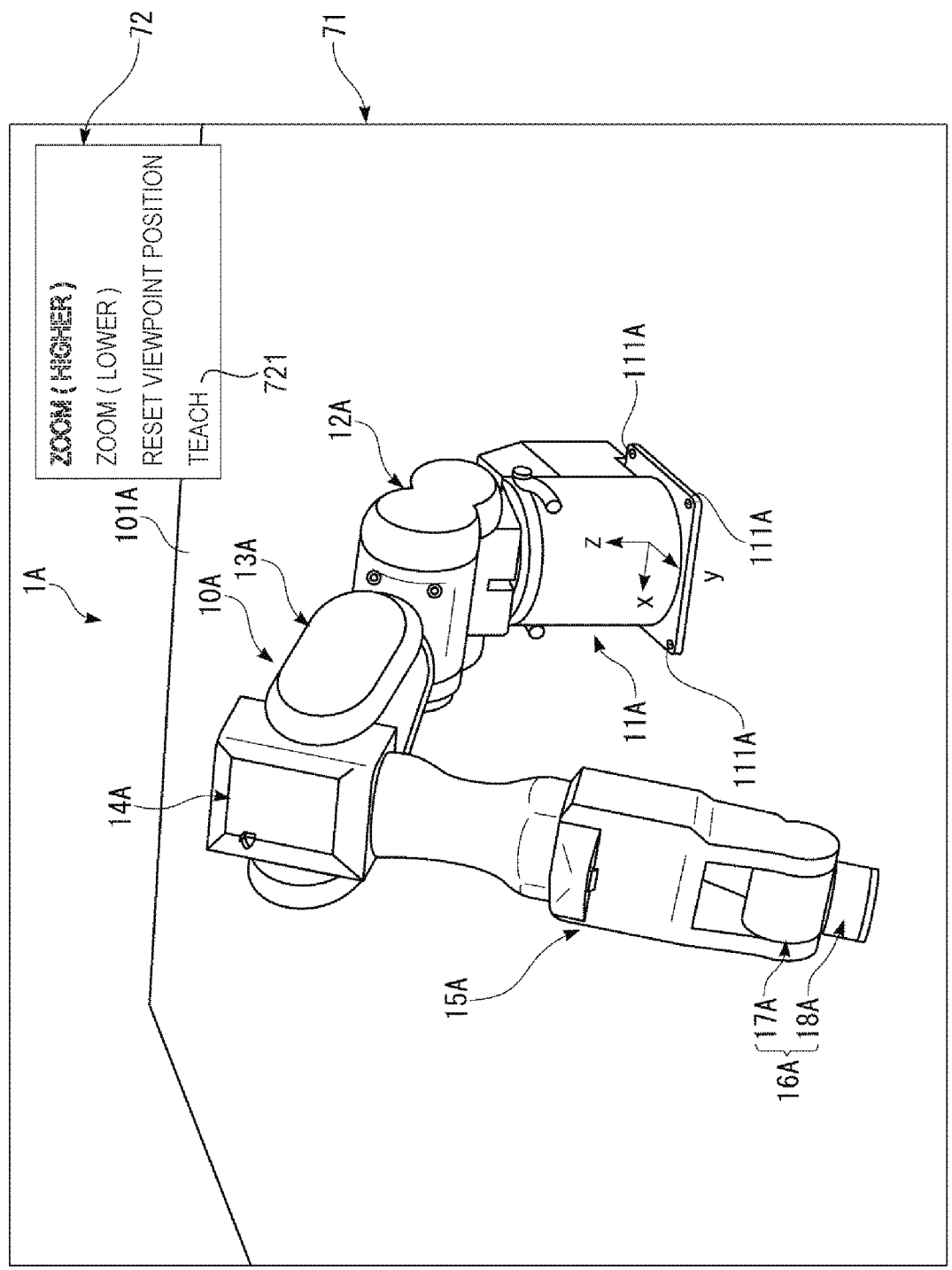
FIG. 16 is a diagram for explanation of an operation of registering a taught point.
Figure 17:
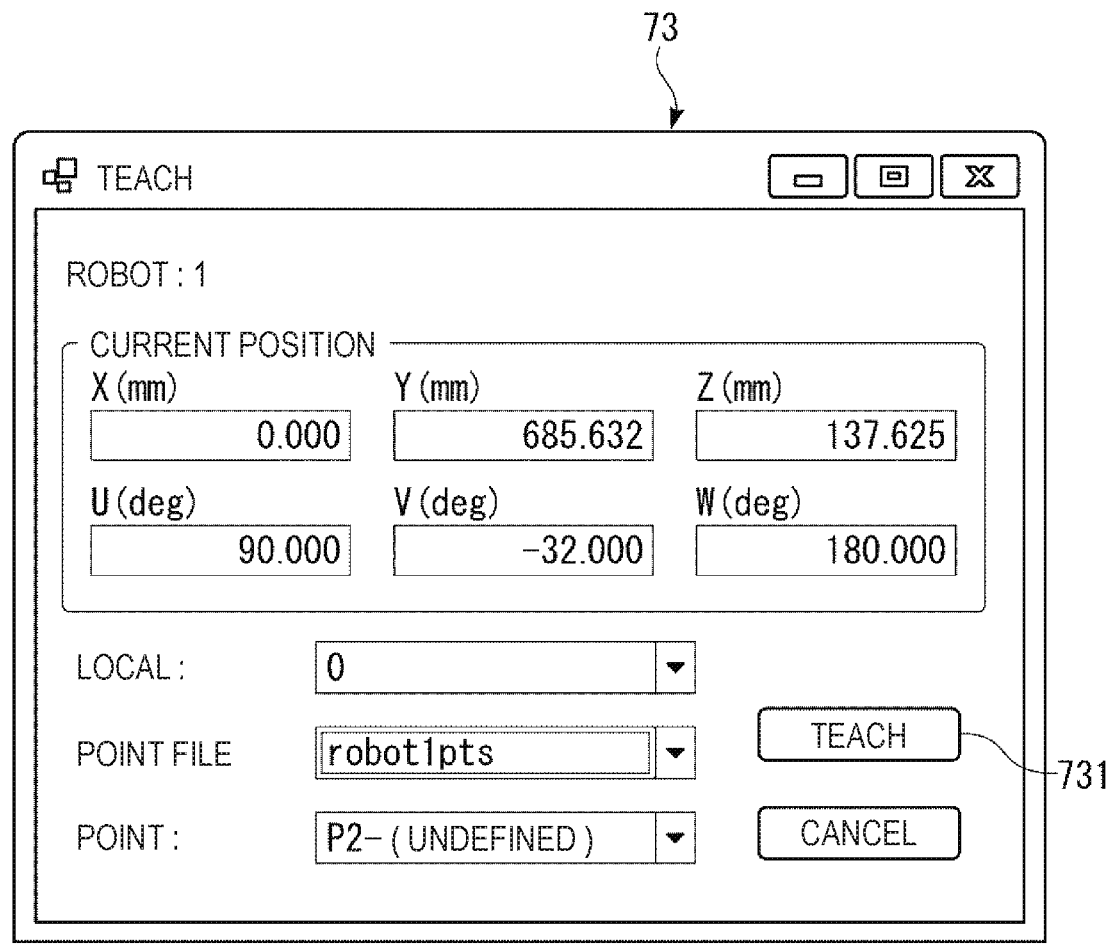
FIG. 17 shows a teach dialog box displayed on the display device.

FIG. 1 is a perspective view showing an embodiment of a robot according to the invention. FIG. 2 is a schematic diagram of the robot shown in FIG. 1. FIG. 3 is a block diagram of a main part of embodiments of the robot and a robot control apparatus according to the invention. FIG. 4 is a block diagram showing the first embodiment of a simulation apparatus according to the invention. FIG. 5 is a flowchart showing control actions of the simulation apparatus shown in FIG. 4. FIGS. 6 to 10 are respectively diagrams for explanation of a simulation of the simulation apparatus shown in FIG. 4. FIG. 11 shows a toolbar displayed on a display device. FIGS. 12 and 13 respectively show Teach Joint Positions displayed on the display device. FIGS. 14 and 15 are respectively diagrams for explanation of a simulation of the simulation apparatus shown in FIG. 4. FIG. 16 is a diagram for explanation of an operation of registering a taught point. FIG. 17 shows a teach dialog box displayed on the display device.

Hereinafter, for convenience of explanation, the upside in FIGS. 1 and 2 is referred to as "up" or "upper" and the downside is referred to as "low" or "lower" (the same applies to the drawings showing the virtual robot). Further, the base side in FIGS. 1 and 2 is referred to as "proximal end" or "upstream" and the opposite side is referred to as "distal end" or "downstream" (the same applies to the drawings showing a virtual robot). Furthermore, upward and downward directions in FIGS. 1 and 2 are referred to as "vertical directions" and rightward and leftward directions are referred to as "horizontal directions" (the same applies to the drawings showing the virtual robot). In the specification, "horizontal" includes not only the completely horizontal case but also inclined cases within ±5° with respect to horizontal. Similarly, in the specification, "vertical" includes not only the completely vertical case but also inclined cases within ±5° with respect to vertical. Further, in the specification, "parallel" includes not only the case where two lines (including axes) or surfaces are completely parallel to each other but also the cases having angles within ±5°. Furthermore, in the specification, "orthogonal" includes not only the case where two lines (including axes) or surfaces are completely orthogonal to each other but also the cases having angles within ±5°.

Figure 6:
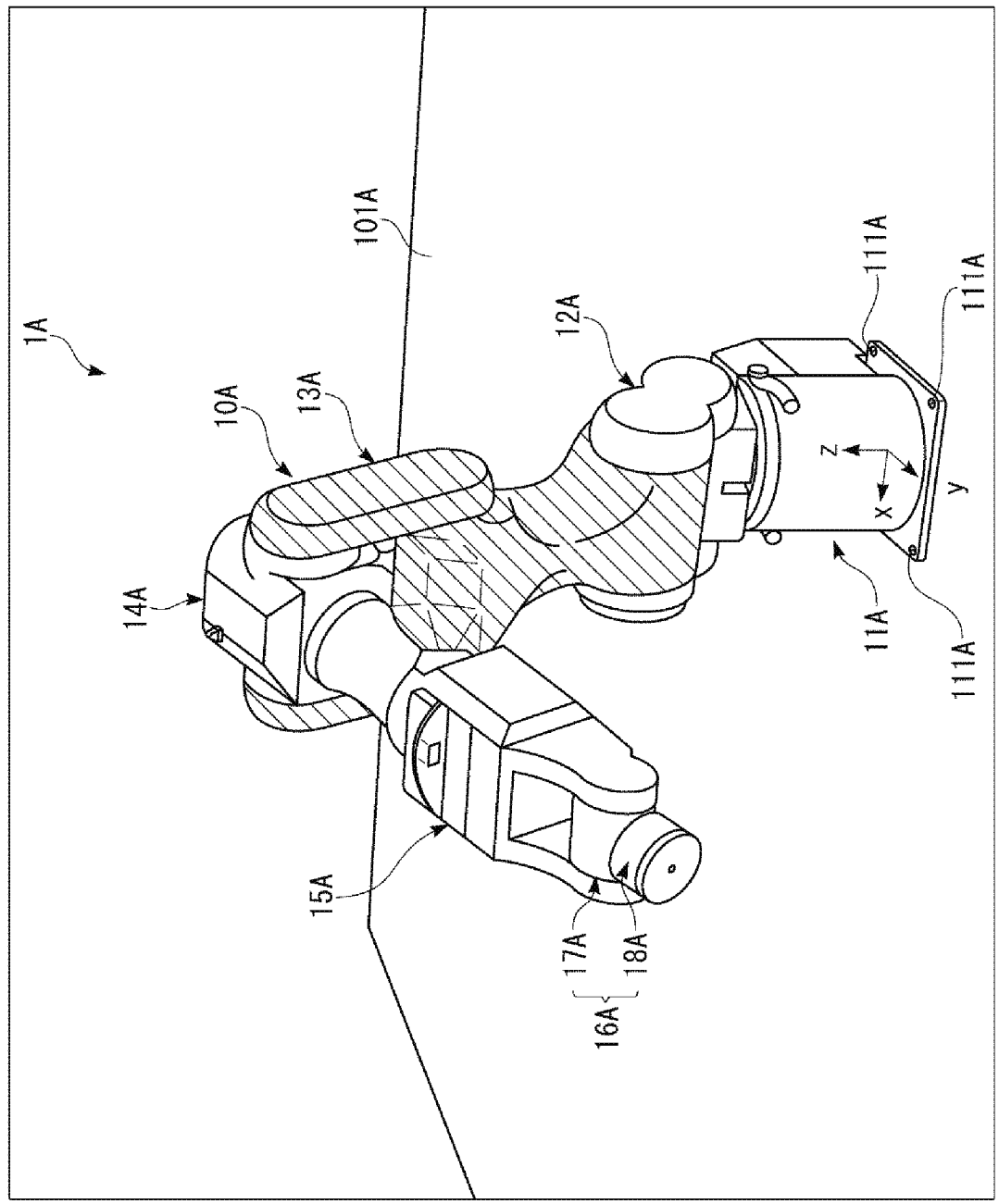
FIG. 6 is a diagram for explanation of a simulation of the simulation apparatus shown in FIG. 4.

In the embodiment, in a virtual robot 1A, a virtual robot coordinate system as a three-dimensional coordinate system having the origin on the bottom surface of a virtual base 11A of the virtual robot 1A and having a z-axis orthogonal to the bottom surface of the virtual base 11A, an x-axis orthogonal to the z-axis, and a y-axis orthogonal to the x-axis and the z-axis is set (see FIG. 6). Further, in the embodiment, the xy plane of the virtual robot coordinate system, the virtual floor surface (upper surface) of a virtual floor 101A, and the horizontal plane are parallel to one another.

A simulation apparatus 5 shown in FIG. 4 is an apparatus that performs a simulation of an action of the virtual robot 1A on a virtual space, i.e., an apparatus that allows the virtual robot 1A including a virtual robot arm 10A displayed on a display device 6 to act. The virtual space is the three-dimensional space in the embodiment, but not limited to that.

A robot control apparatus 20 shown in FIG. 3 controls a robot 1 including a robot arm 10 based on a result of a simulation (simulation result) by the simulation apparatus 5, which will be described later in detail. According to the simulation apparatus 5, the robot arm 10 (robot 1) may be taught offline easily and promptly, and, according to the robot control apparatus 20, the robot 1 may be allowed to precisely act based on the obtained teaching data.

The robot 1 shown in FIGS. 1 to 3 includes the robot arm 10 and is controlled by the robot control apparatus 20. According to the simulation apparatus 5, the robot arm 10 (robot 1) may be taught offline easily and promptly, and, according to the robot 1, the robot may precisely act based on the obtained teaching data.

Note that, regarding the correspondence relationships between the signs of the real robot 1 and the signs of the virtual robot 1A, the signs of the respective parts of the virtual robot 1A are respectively shown with "A" after the signs of the corresponding respective parts of the robot 1. Further, the names of the respective parts of the virtual robot 1A are respectively shown with "virtual" before the names of the corresponding respective parts of the real robot 1. The description of the virtual robot 1A is substituted by the description of the robot 1.

First, the robot 1 and the robot control apparatus 20 are explained.

A robot system 100 shown in FIG. 1 includes the robot 1 and the robot control apparatus 20 that controls the robot 1 with the robot arm 10 or the like of the robot 1. That is, the robot 1 is controlled by the robot control apparatus. The uses of the robot system 100 are not particularly limited. The robot system 100 may be used in work of holding, carrying, assembly, inspection, etc. of works (objects) including electronic components and electronic apparatuses.

In the embodiment, the robot control apparatus 20 is provided separately from the robot 1. In this case, for example, the robot 1 and the robot control apparatus 20 may be connected by a cable (wire) for wired communications, or the cable may be omitted for wireless communications. That is, the robot 1 and the robot control apparatus 20 may be connected via wired communications or wireless communications.

The robot control apparatus 20 is not limited to the separate configuration from the robot 1, but a part or all thereof may be provided inside of the robot 1. In this case, for example, the robot control apparatus 20 can be provided within the base 11 of the robot 1.

The robot control apparatus 20 may be formed using e.g. a personal computer (PC) containing a CPU (Central Processing Unit) with programs (OS etc.) installed therein. The robot control apparatus 20 includes a first drive source control unit 201 that controls actuation (driving) of a first drive source 401 of the robot 1, which will be described later, a second drive source control unit 202 that controls actuation of a second drive source 402, a third drive source control unit 203 that controls actuation of a third drive source 403, a fourth drive source control unit 204 that controls actuation of a fourth drive source 404, a fifth drive source control unit 205 that controls actuation of a fifth drive source 405, a sixth drive source control unit 206 that controls actuation of a sixth drive source 406, a control unit 207, a memory unit 208 that stores respective information, etc. The control unit 207 has e.g. a CPU etc. Further, the memory unit 208 has e.g. a hard disk, RAM, ROM in which programs or the like is stored, etc. Further, the functions of the robot control apparatus 20 may be realized by execution of various programs by the CPU, for example.

As shown in FIGS. 1 and 2, the robot 1 includes the base 11 and the robot arm 10. The robot arm 10 includes a first arm 12, a second arm 13, a third arm 14, a fourth arm 15, a fifth arm 17, a sixth arm 18, the first drive source 401, the second drive source 402, the third drive source 403, the fourth drive source 404, the fifth drive source 405, and the sixth drive source 406. Furthermore, a wrist 16 is formed by the fifth arm 17 and the sixth arm 18 and, for example, an end effector (not shown) such as a hand may be detachably attached to the distal end of the sixth arm 18, i.e., a distal end surface 163 of the wrist 16. When the end effector is attached, the end effector is a component element of the robot arm 10. For example, the robot 1 controls the actions of the arms 12 to 15, the wrist 16, etc. while grasping a work with the hand, and thereby, may perform various kinds of work such as carrying of the work.

The robot 1 is a vertical articulated (six-axis) robot in which the base 11, the first arm 12, the second arm 13, the third arm 14, the fourth arm 15, the fifth arm 17, and the sixth arm 18 are sequentially coupled from the proximal end side toward the distal end side. Hereinafter, the first arm 12, the second arm 13, the third arm 14, the fourth arm 15, the fifth arm 17, the sixth arm 18, and the wrist 16 are respectively also referred to as "arm". The first drive source 401, the second drive source 402, the third drive source 403, the fourth drive source 404, the fifth drive source 405, and the sixth drive source 406 are respectively also referred to as "drive source". Note that the lengths of the arms 12 to 15, 17, and 18 are respectively not particularly limited, but can be appropriately set.

The base 11 and the first arm 12 are coupled via a joint 171. The first arm 12 is rotatable around a first rotation axis O1 parallel to the vertical direction about the first rotation axis O1 with respect to the base 11. The first rotation axis O1 coincides with the normal of the upper surface of a floor 101 as an installation surface of the base 11. The first rotation axis O1 is a rotation axis on the most upstream side of the robot 1. The first arm 12 is rotated by driving of the first drive source 401 having a motor (first motor) 401M and a reducer (not shown). Further, the motor 401M is controlled by the robot control apparatus 20 via a motor driver 301. Note that the reducer may be omitted.

The first arm 12 and the second arm 13 are coupled via a joint 172. The second arm 13 is rotatable around a second rotation axis O2 parallel to the horizontal direction with respect to the first arm 12. The second rotation axis O2 is orthogonal to the first rotation axis O1. The second arm 13 is rotated by driving of the second drive source 402 having a motor (second motor) 402M and a reducer (not shown). Further, the motor 402M is controlled by the robot control apparatus 20 via a motor driver 302. Note that the reducer may be omitted. The second rotation axis O2 may be parallel to an axis orthogonal to the first rotation axis O1.

The second arm 13 and the third arm 14 are coupled via a joint 173. The third arm 14 is rotatable around a third rotation axis O3 parallel to the horizontal direction about the third rotation axis O3 with respect to the second arm 13. The third rotation axis O3 is parallel to the second rotation axis O2. The third arm 14 is rotated by driving of the third drive source 403 having a motor (third motor) 403M and a reducer (not shown). Further, the motor 403M is controlled by the robot control apparatus 20 via a motor driver 303. Note that the reducer may be omitted.

The third arm 14 and the fourth arm 15 are coupled via a joint 174. The fourth arm 15 is rotatable around a fourth rotation axis O4 parallel to the center axis direction of the third arm 14 about the fourth rotation axis O4 with respect to the third arm 14. The fourth rotation axis O4 is orthogonal to the third rotation axis O3. The fourth arm 15 is rotated by driving of the fourth drive source 404 having a motor (fourth motor) 404M and a reducer (not shown). Further, the motor 404M is controlled by the robot control apparatus 20 via a motor driver 304. Note that the reducer may be omitted. The fourth rotation axis O4 may be parallel to an axis orthogonal to the third rotation axis O3.

The fourth arm 15 and the fifth arm 17 of the wrist 16 are coupled via a joint 175. The fifth arm 17 is rotatable around a fifth rotation axis O5 about the fifth rotation axis O5 with respect to the fourth arm 15. The fifth rotation axis O5 is orthogonal to the fourth rotation axis O4. The fifth arm 17 is rotated by driving of the fifth drive source 405 having a motor (fifth motor) 405M and a reducer (not shown). Further, the motor 405M is controlled by the robot control apparatus 20 via a motor driver 305. Note that the reducer may be omitted. The fifth rotation axis O5 may be parallel to an axis orthogonal to the fourth rotation axis O4.

The fifth arm 17 and the sixth arm 18 of the wrist 16 are coupled via a joint 176. The sixth arm 18 is rotatable around a sixth rotation axis O6 about the sixth rotation axis O6 with respect to the fifth arm 17. The sixth rotation axis O6 is orthogonal to the fifth rotation axis O5. The sixth arm 18 is rotated by driving of the sixth drive source 406 having a motor (sixth motor) 406M and a reducer (not shown). Further, the motor 406M is controlled by the robot control apparatus 20 via a motor driver 306. Note that the reducer may be omitted. The sixth rotation axis O6 may be parallel to an axis orthogonal to the fifth rotation axis O5.

The wrist 16 has a wrist main body 161 in a cylindrical shape as the sixth arm 18. Further, the wrist has a support ring 162 in a ring shape separately formed from the wrist main body 161 and provided in the proximal end of the wrist main body 161.

In the drive sources 401 to 406, a first angle sensor 411, a second angle sensor 412, a third angle sensor 413, a fourth angle sensor 414, a fifth angle sensor 415, and a sixth angle sensor 416 are provided in the respective motors or reducers. These angle sensors are not particularly limited, but encoders such as rotary encoders may be used. By the angle sensors 411 to 416, rotation angles of the rotation shafts of the motors or reducers of the drive sources 401 to 406 are detected, respectively.

The motors of the drive sources 401 to 406 are not respectively particularly limited, but e.g. servo motors such as AC servo motors or DC servo motor may be preferably used.

The robot 1 is connected to the robot control apparatus 20. That is, the drive sources 401 to 406 and the angle sensors 411 to 416 are respectively connected to the robot control apparatus 20.

The robot control apparatus 20 may respectively independently actuate the arms 12, 13, 14, 15, 17, 18, that is, may respectively independently control the drive sources 401 to 406 via the motor drivers 301 to 306. In this case, the robot control apparatus 20 performs detection using the angle sensors 411 to 416, and respectively controls driving of the drive sources 401 to 406 e.g. angular velocities, rotation angles, etc. based on the detection results. The control program is stored in advance in the memory unit 208 of the robot control apparatus 20.

In the embodiment, the base 11 is a part located in the lowermost position of the robot 1 in the vertical direction and fixed (installed) to the floor 101 or the like of the installation space. The fixing method is not particularly limited, but, for example, in the embodiment, the fixing method using a plurality of bolts 111 is used.

In the base 11, for example, the motor 401M, the motor drivers 301 to 306, etc. are housed.

The arms 12 to 15 are respectively have hollow arm main bodies 2, drive mechanisms 3 housed in the arm main bodies and including motors, and sealing members 4 that seal the interiors of the arm main bodies 2. Note that, in the drawing, the arm main body 2, the drive mechanism 3, and the sealing member 4 of the first arm 12 are also respectively referred to as "2a", "3a", "4a", the arm main body 2, the drive mechanism 3, and the sealing member 4 of the second arm 13 are also respectively referred to as "2b", "3b", "4b", the arm main body 2, the drive mechanism 3, and the sealing member 4 of the third arm 14 are also respectively referred to as "2c", "3c", "4c", and the arm main body 2, the drive mechanism 3, and the sealing member 4 of the fourth arm 15 are also respectively referred to as "2d", "3d", "4d".

Next, the simulation apparatus 5 will be explained and, first, the virtual robot 1A is briefly explained.

As shown in FIG. 6, the virtual robot 1A is the same as the above described robot 1 and includes a virtual base 11A and a virtual robot arm 10A. The virtual robot arm 10A includes a plurality of rotatably provided arms, in the embodiment, a virtual first arm 12A, a virtual second arm 13A, a virtual third arm 14A, a virtual fourth arm 15A, a virtual fifth arm 17A, and a virtual sixth arm 18A. Further, the virtual robot arm 10A includes a plurality of virtual drive sources that drive these arms, in the embodiment, six virtual drive sources (not shown).

A virtual wrist 16A is formed by the virtual fifth arm 17A and the virtual sixth arm 18A, and, for example, a virtual end effector (not shown) such as a virtual hand may be detachably attached to the distal end of the virtual sixth arm 18A, i.e., the distal end of the virtual wrist 16A.

Note that the following explanation of the simulation apparatus 5 will be made without the virtual end effector attaching to the virtual sixth arm 18A of the virtual robot 1A.

First, the outline of the simulation apparatus 5will be explained in correspondence with the description of the appended claims, and then, the specific explanation will be made.

The simulation apparatus 5 shown in FIG. 4 is an apparatus that allows the virtual robot arm 10A (virtual robot 1A) displayed in the display device 6 to act. The simulation apparatus 5 includes a receiving unit 53 that receives drag operation for the distal end of the virtual robot arm 10A from an input device (input unit) 7, and a display control unit 51 that changes the attitude of the virtual robot arm 10A based on the drag operation received by the receiving unit 53.

The drag operation refers to an operation of pinching a predetermined part of an object, moving (e.g. translating, rotating, or the like) the object to a predetermined position, and releasing the object in an image displayed on the display device 6. Further, pinching the predetermined part of the object is designating the predetermined part of the object to be moved. A specific example includes e.g. an operation of operating the input device 7 such as a mouse, pinching a predetermined part of an object with a pointer, moving the object to a predetermined position, and releasing the object.

According to the simulation apparatus 5, the drag operation for the distal end of the virtual robot arm 10A is performed and the attitude of the virtual robot arm 10A is changed according to the drag operation, and thereby, the attitude of the virtual robot arm 10A may be changed easily and promptly and, as a result, teaching data of the robot arm 10 (robot 1) may be created offline easily and promptly. That is, teaching, specifically, rough teaching may be performed on the robot arm 10 (robot 1) offline.

Further, the virtual robot arm 10A shown in FIG. 6 has the six virtual arms 12A, 13A, 14A, 15A, 17A, 18A (plurality of virtual arms). The attitude of at least one virtual arm of the virtual arms 12A, 13A, 14A, 15A, 17A, 18A (plurality of virtual arms) is changeable by the drag operation received by the receiving unit 53. In the embodiment, the attitudes of the virtual arms 12A, 13A, 14A, 15A, 17A, 18A are respectively changeable by the drag operation received by the receiving unit 53. Thereby, the attitudes of the virtual arms 12A, 13A, 14A, 15A, 17A, 18A may be individually changed and teaching data may be created, and the attitude of the virtual robot arm 10A may be easily changed to a target attitude.

In the simulation apparatus 5, when the receiving unit 53 receives an instruction to fix the position of the distal end of the virtual robot arm 10A, the attitude of the virtual robot arm 10A can be changed with the position of the distal end of the virtual robot arm 10A fixed. Thereby, the attitude of the virtual robot arm 10A can be changed easily and promptly with the position of the distal end of the virtual robot arm 10A fixed. The function may be used, for example, in the cases where avoidance of interferences between the robot arm 10 and peripherals is desired, where the change of only the attitude of the robot arm 10 grasping a predetermined object without moving the object is desired, etc. during actual work. As below, the function will be specifically explained.

As shown in FIG. 4, the simulation apparatus 5 includes the display control unit 51, a memory unit 52, and the receiving unit 53. The simulation apparatus 5 has a function of performing a simulation of an action of the virtual robot 1A on the virtual space, i.e., a function of allowing the virtual robot 1A displayed on the display device 6 to act. Further, the simulation apparatus 5 is used for offline teaching for the robot 1, specifically, rough teaching.

The display control unit 51 has a function of allowing the display device 6 to display various images (including various screens such as windows), characters, etc. That is, the display control unit 51 controls driving of the display device 6. The function of the display control unit 51 may be realized by e.g. a GPU or the like.

The memory unit 52 has a function of storing various kinds of information (including data and programs). The memory unit 52 stores programs etc. The function of the memory unit 52 may be realized by e.g. a hard disk, RAM, ROM, or the like or the so-called external memory device.

The receiving unit 53 has a function of receiving respective input such as input from the input device 7. The function of the receiving unit 53 may be realized by e.g. an interface circuit. Or, for example, when a touch panel is used, the receiving unit 53 has a function as an input sensing unit that senses contact of the finger of the user on the touch panel or the like.

The simulation apparatus 5 is communicable via wired or wireless connection to the display device 6 that can display the respective images including images showing simulations. The display device 6 includes a monitor (not shown) formed using e.g. a liquid crystal display or EL display, and has a function of displaying e.g. various images (including various screens such as windows), characters, etc. Therefore, the user may recognize the action, attitude, etc. of the virtual robot 1A.

Further, the simulation apparatus 5 is communicable via wired or wireless connection to the input device 7 that enables various input operations (input) to the simulation apparatus 5. The input device 7 includes e.g. a mouse, keyboard, etc. Therefore, the user may give instructions (input) of various kinds of processing etc. to the simulation apparatus 5 by operating the input device 7.

Specifically, the user may give instructions to the simulation apparatus 5 by the operation of clicking various screens (windows etc.) displayed on the display device 6 with the mouse of the input device 7 or the operation of inputting characters, numerals, etc. with the keyboard of the input device 7. Hereinafter, the instructions using the input device 7 by the user (the input by the input device 7) is also referred to as "operation instruction". The operation instruction includes a selection operation of selecting a desired content from the contents displayed on the display device 6 with the input device 7 and an input instruction of inputting characters, numerals, etc. with the input device 7. Further, the input also includes selection.

The display device 6 and the input device 7 are separately provided, however, not limited to that. The display device 6 may include the input device 7 (input unit). That is, in place of the display device 6 and the input device 7, a display and input device (not shown) serving as both the display device 6 and the input device 7 may be provided. As the display and input device, e.g. a touch panel (electrostatic touch panel or pressure-sensitive touch panel) or the like may be used. Thereby, it is not necessary to prepare the input device 7 separately in addition to the display device 6 and the convenience is higher.

A simulation system is formed by the simulation apparatus 5, the input device 7, and the display device 6. Note that, in place of the display device 6, the simulation apparatus 5 may include a display device (display unit), or the simulation apparatus 5 may include a display device (display unit) separately from the display device 6. Or, in place of the input device 7, the simulation apparatus 5 may include the input device 7 (input unit), or the simulation apparatus 5 may include an input device (input unit) separately from the input device 7.

As below, a simulation performed by the simulation apparatus 5 will be explained.

In the simulation apparatus 5, regarding the action of the virtual robot 1A by operation of the input device 7, the following configuration 1, configuration 2, and configuration 3 can be employed. Further, in the simulation apparatus 5, the configuration 1, the configuration 2, and the configuration 3 are set as a first action mode, a second action mode, and a third action mode, respectively. Note that, in the simulation apparatus 5, if the configuration 1 is feasible, only one or none of the configuration 2 and the configuration 3 may be feasible.

Configuration 1

In the simulation apparatus 5, actions to individually rotate the virtual arms 12A, 13A, 14A, 15A, 17A, 18A of the virtual robot 1A to target angles, i.e., actions to rotate only a predetermined object virtual arm of the virtual arms 12A, 13A, 14A, 15A, 17A, 18A can be performed by drag operation.

As shown in FIG. 11, a tool bar 81 is displayed on the display device 6. The user operates the input device 7 to press a rotation/jog button 82 (icon) of the tool bar 81.

Thereby, the receiving unit 53 of the simulation apparatus 5 receives the operation of pressing the rotation/jog button 82 input from the input device 7. The display control unit 51 enables the virtual arms 12A, 13A, 14A, 15A, 17A, 18A of the virtual robot 1A to be individually rotated by drag operation.

The user operates the input device 7 while viewing the images displayed on the display device 6 to perform drag operation on the object virtual arm of the virtual arms 12A, 13A, 14A, 15A, 17A, 18A of the virtual robot 1A. That is, the user operates the input device 7 to hold the object virtual arm with a pointer, rotate the virtual arm to the target angle, and release the virtual arm.

Figure 7:
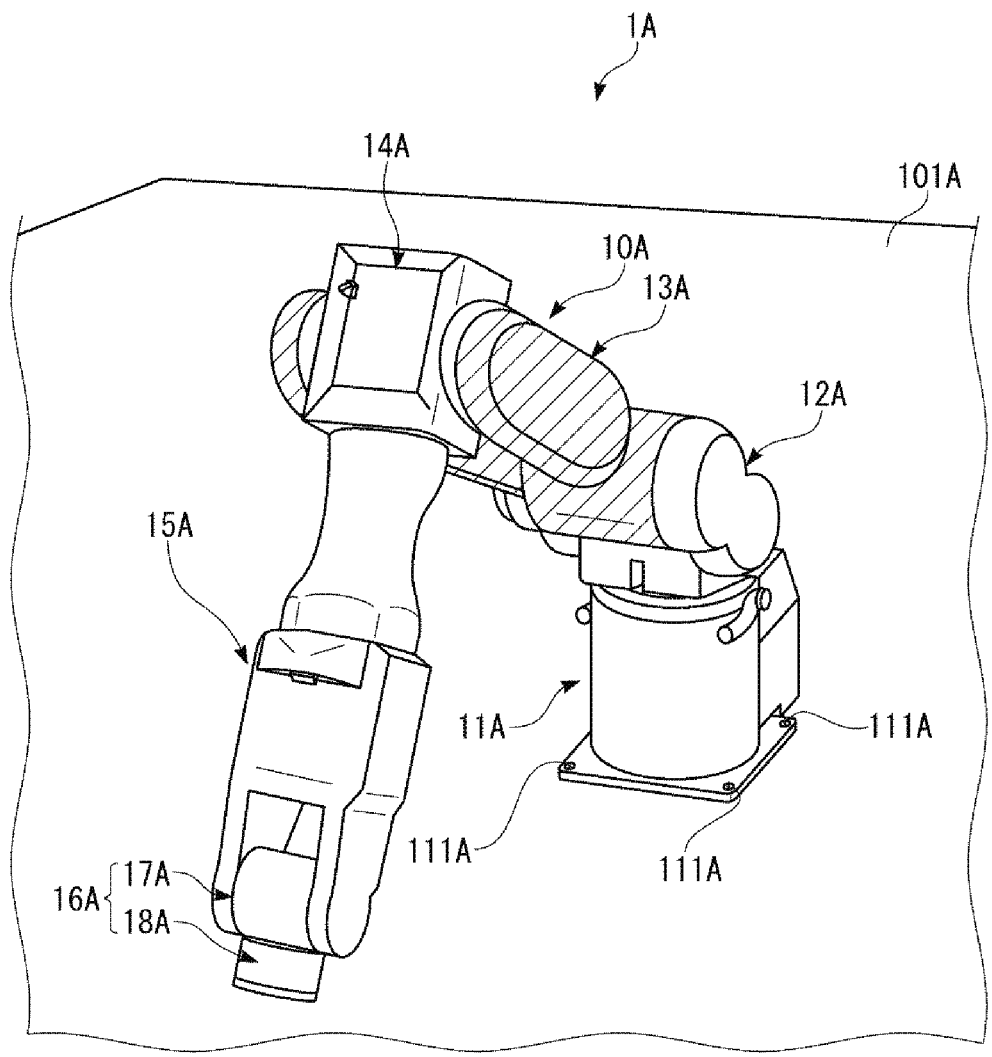
FIG. 7 is a diagram for explanation of the simulation of the simulation apparatus shown in FIG. 4.

In this case, first, the user operates the input device 7 to perform an operation of holding the object virtual arm with the pointer (the click operation of the mouse). The receiving unit 53 of the simulation apparatus 5 receives the operation instruction by the user and, as shown in FIG. 6, the display control unit 51 controls the display device 6 to change the color of the object virtual arm into another color (e.g. blue). In the embodiment, the object virtual arm is the virtual second arm 13A. In FIGS. 6 and 7, the virtual second arm 13A is shaded to show that the color has been changed. Thereby, the object virtual arm, i.e., the virtual second arm 13A may be easily recognized. Note that, as below, the case where the object virtual arm is the virtual second arm 13A will be representatively explained.

Then, the user operates the input device 7 to rotate the virtual second arm 13A held with the pointer to the target angle, and release the arm. The receiving unit 53 of the simulation apparatus 5 receives the operation instruction by the user and, as shown in FIG. 7, the display control unit 51 controls the display device 6 to change the attitude of the virtual robot arm 10A based on the drag operation on the virtual second arm 13A received by the receiving unit 53. That is, the user rotates the virtual second arm 13A in a target direction to the target angle.

In this case, the display control unit 51 obtains the direction and the amount of rotation to rotate the virtual second arm 13A based on the movement direction and the amount of movement of the mouse of the input device 7 with the object virtual arm held with the pointer (the movement direction and the amount of movement of the pointer) as seen from the viewpoint direction of the display device 6, and rotates the virtual second arm 13A.

Then, the user operates the input device 7 to perform an operation of registering a taught point (taught position). Thereby, the simulation apparatus 5 stores the taught point in the memory unit 52. The operation of registering the taught point will be described later in detail.

Here, to store (register) the taught point is to store (register) a predetermined part of the virtual robot arm 10A, in the embodiment, the rotation angles of the respective virtual arms 12A, 13A, 14A, 15A, 17A, 18A when the distal end of the center of the virtual sixth arm 16A is located in a target position (taught point) in the memory unit 52.

Next, a control action of the simulation apparatus 5 with the drag operation by the user will be explained based on a flowchart in FIG. 5. Note that the explanation of the control action based on the flowchart will be representatively made in the configuration example 1, and omitted in the configuration example 2 and the configuration example 3.

As shown in FIG. 5, the receiving unit 53 of the simulation apparatus 5 receives the drag operation on the virtual second arm 13A as the object virtual arm input from the input device 7 (step S101).

Then, the display control unit 51 controls the display device 6 to change the color of the virtual second arm 13A and change the attitude of the virtual robot arm 10A based on the drag operation on the virtual second arm 13A received by the receiving unit 53. That is, the virtual second arm 13A is rotated in the target direction to the target angle (step S102).

Configuration 2

In the simulation apparatus 5, an action to move the distal end of the virtual robot arm 10A of the virtual robot 1A, in the embodiment, the distal end of the center of the virtual sixth arm 18A (tool center point) to the target position can be performed by drag operation. Hereinafter, the distal end of the center of the virtual sixth arm 18A is also referred to as "distal end of the virtual sixth arm 18A".

The user operates the input device 7 to press a button (not shown) for setting the configuration 2 in a feasible action mode.

Thereby, the receiving unit 53 of the simulation apparatus 5 receives the operation of pressing the button input from the input device 7. The display control unit 51 enables the distal end of the virtual sixth arm 18A to be moved to the target position by drag operation.

Figure 8:
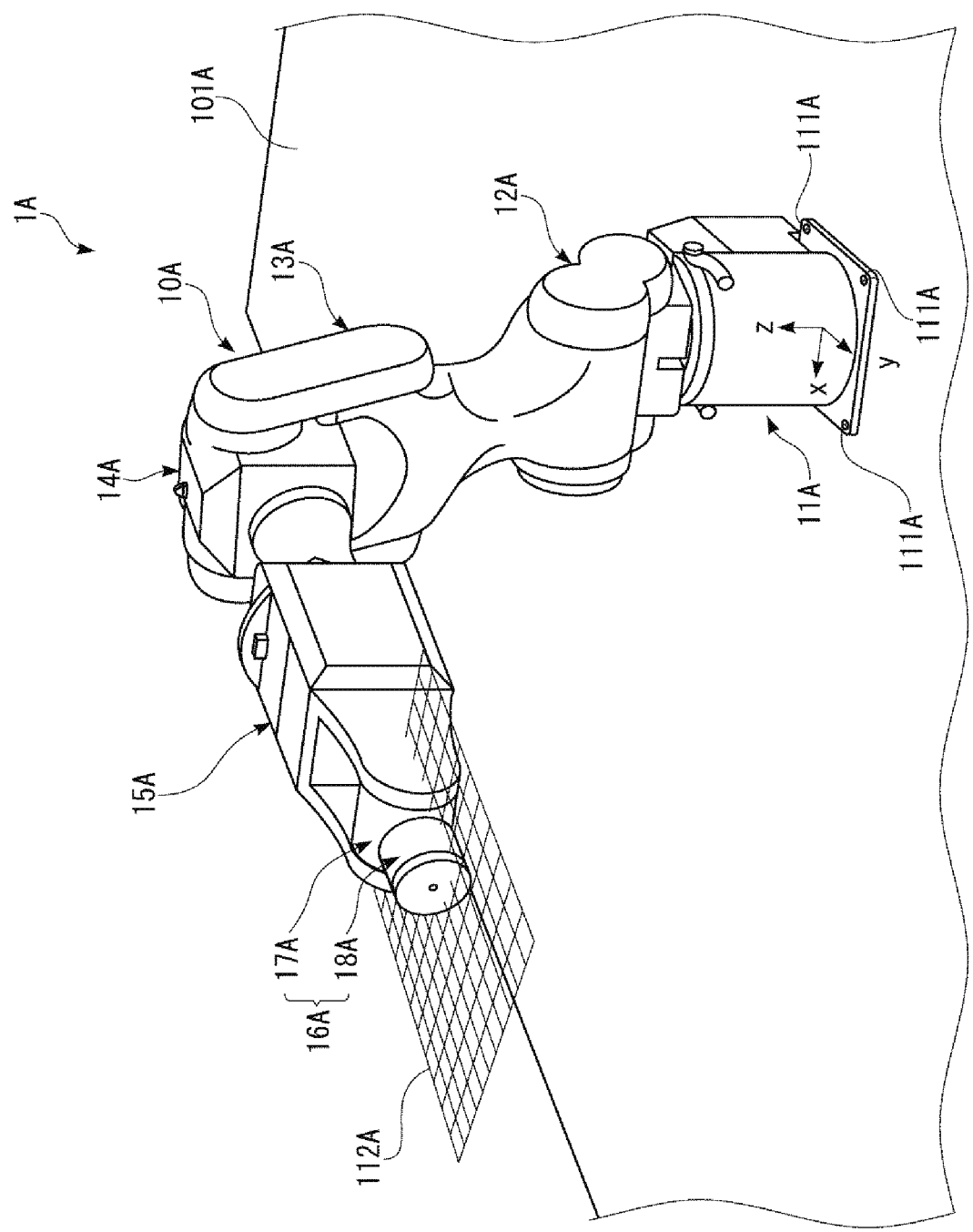
FIG. 8 is a diagram for explanation of the simulation of the simulation apparatus shown in FIG. 4.

Further, as shown in FIG. 8, the display control unit 51 controls the display device 6 to display a virtual mesh 112A in a mesh form in the position of the virtual sixth arm 18A. In the embodiment, the virtual mesh 112A has a quadrangular shape such as square or rectangle, and set in parallel to the xy-plane of the virtual robot coordinate system, i.e., in parallel to the horizontal plane. Therefore, the position of the virtual mesh 112A is changed with the virtual sixth arm 18A, however, the attitude of the virtual mesh 112A is fixed. By the virtual mesh 112A, the configuration 2 in the feasible action mode may be easily recognized and the horizontal plane may be easily recognized, and the mesh may be effectively used in positioning, for example.

The user operates the input device 7 while viewing the images displayed on the display device 6 to perform drag operation on the distal end of the virtual robot arm 10A of the virtual robot 1A, in the embodiment, the distal end of the virtual sixth arm 18A. That is, the user operates the input device 7 to hold the distal end of the virtual sixth arm 18A with the pointer, rotate the distal end to the target position, and release the distal end.

In this case, when the user operates the input device 7 to perform an operation of holding a portion near the virtual sixth arm 18A with the pointer, the receiving unit 53 receives the operation instruction by the user and the display control unit 51 controls the display device 6 to display the pointer holding the distal end of the center of the virtual sixth arm 18A. Thereby, the distal end of the center of the virtual sixth arm 18A may be held with the pointer easily and precisely.

Then, the user operates the input device 7 to move the distal end of the center of the virtual sixth arm 18A held with the pointer to the target position and release the distal end. The receiving unit 53 of the simulation apparatus 5 receives the operation instruction by the user and, as shown in FIG.

Figure 9:
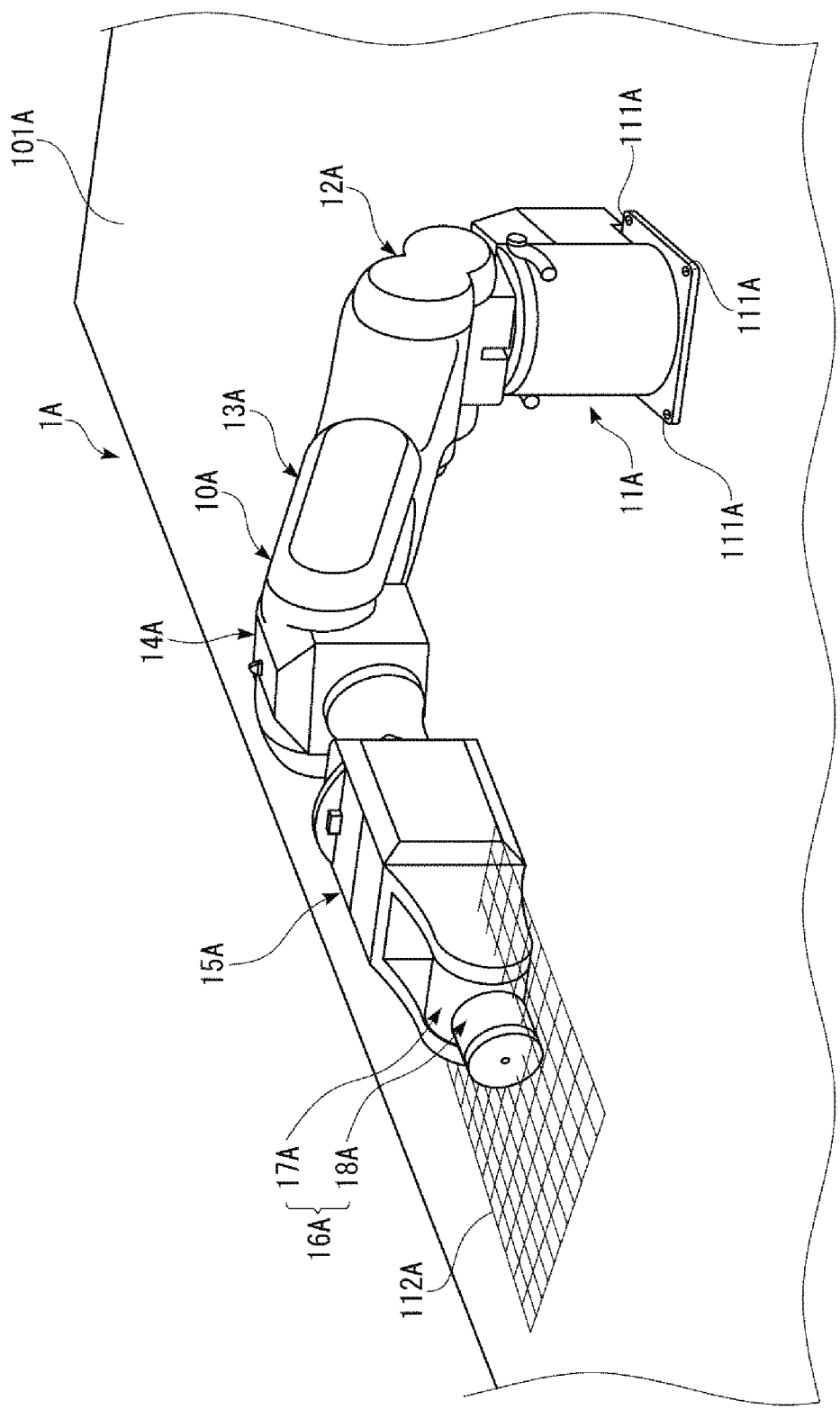
FIG. 9 is a diagram for explanation of the simulation of the simulation apparatus shown in FIG. 4.

9, the display control unit 51 controls the display device 6 to change the attitude of the virtual robot arm 10A and move the distal end of the center of the virtual sixth arm 18A to the target position based on the drag operation on the distal end of the center of the virtual sixth arm 18A received by the receiving unit 53. Note that FIG. 9 shows an example of moving the distal end of the center of the virtual sixth arm 18A in the distal end direction (to the left in FIG. 9).

In this case, the display control unit 51 obtains the directions and the amounts of rotation of the rotations of the virtual arms 12A, 13A, 14A, 15A, 17A, 18A based on the movement direction and the amount of movement of the mouse of the input device 7 with the distal end of the center of the virtual sixth arm 18A held with the pointer (the movement direction and the amount of movement of the pointer) as seen from the viewpoint direction of the display device 6, and changes the attitude of the virtual robot arm 10A. In the embodiment, the attitude of the virtual robot arm 10A may be precisely changed as long as the first position and the last position of the distal end of the center of the virtual sixth arm 18A may be specified, however, for example, in the change of the attitude of the virtual robot arm 10A, the movement trajectory between the first position and the last position of the distal end of the center of the virtual sixth arm 18A may be considered.

Then, the user operates the input device 7 to perform an operation of registering a taught point. Thereby, the simulation apparatus 5 stores the taught point in the memory unit 52.

Figure 10:
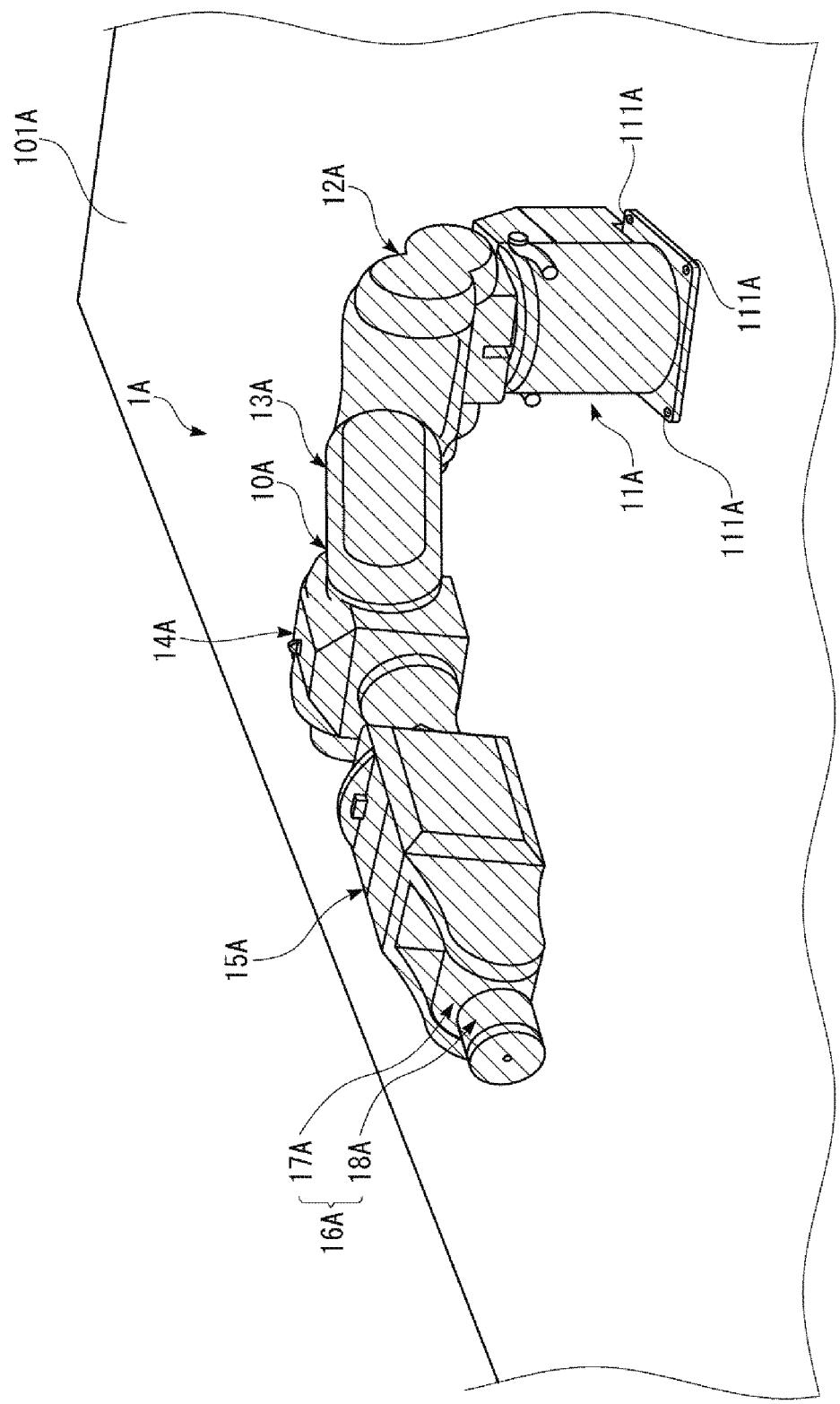
FIG. 10 is a diagram for explanation of the simulation of the simulation apparatus shown in FIG. 4.

Here, as shown in FIG. 10, in the case where the attitude of the virtual robot arm 10A is an impossible attitude of the virtual robot arm 10A by the drag operation, the display control unit 51 changes the display form of the display device 6. The specific examples of the change of the display form of the display device 6 include change of the color, display of characters of "impossible attitude", "NG", or the like. When the color is changed, for example, the color of the virtual robot arm 10A (virtual robot 1A) is changed to red that facilitates imagining an impossible attitude. In the embodiment, the color of the whole virtual robot 1A is changed to another color (e.g. red). FIG. 10 shows that the color has been changed by shading on the virtual robot 1A. Thereby, the situation that the attitude of the virtual robot arm 10A is an impossible attitude of the virtual robot arm 10A may be recognized easily and precisely.

Note that, in the embodiment, the distal end of the center of the virtual sixth arm 18A is moved by the drag operation, however, the operation is not limited to the drag operation. For example, the pointer may be placed in the position as the movement destination of the distal end of the center of the virtual sixth arm 18A, by click operation of the mouse of the input device 7, the attitude of the virtual robot arm 10A may be changed and the distal end of the center of the virtual sixth arm 18A may be moved to the position as the movement destination.

Configuration 3

In the simulation apparatus 5, an action to change the attitude of the virtual robot arm 10A to a target attitude while fixing the distal end of the virtual robot arm 10A of the virtual robot 1A, in the embodiment, the position of the distal end of the center of the virtual sixth arm 18A can be performed by operation of the input device 7.

The user operates the input device 7 to press a Lock button 62 of a Teach Joint Positions panel 61 (window) shown in FIG. 12 displayed on the display device 6 (see FIG. 13).

Thereby, the receiving unit 53 of the simulation apparatus 5 receives the operation of pressing the Lock button 62 input from the input device 7. The display control unit 51 fixes the position of the distal end of the center of the virtual sixth arm 18A. Thereby, the attitude of the virtual robot arm 10A becomes changeable with the position of the distal end of the center of the virtual sixth arm 18A fixed.

The user operates the input device 7 to move a slide bar 64 corresponding to a virtual arm (Joint) to rotate of the virtual arms 12A, 13A, 14A, 15A, 17A, 18A (Joints 1, 2, 3, 4, 5, 6) in Joint Control 63 in the Teach Joint Positions panel 61 shown in FIG. 13 and change the rotation angle so that the attitude of the virtual robot arm 10A may be a target attitude. The rotation angle is a rotation angle when letting the reference attitude of the virtual robot arm 10A be 0°, and displayed in a text box 65 corresponding thereto. Note that a numeric value can be input directly in the text box 65. As below, in the embodiment, the case where the rotation angle of the virtual fifth arm 17A is change will be representatively explained.

The receiving unit 53 of the simulation apparatus 5 receives the operation instruction by the user and the display control unit 51 controls the display device 6 to rotate the virtual fifth arm 17A to a target rotation angle. Thereby, the attitude of the virtual robot arm 10A is changed from the attitude shown in FIG. 14 to the attitude shown in FIG. 15.

Then, the user operates the input device 7 to perform an operation of registering a taught point. Thereby, the simulation apparatus 5 stores the taught point in the memory unit 52.

Next, the operation of registering the taught point will be explained.

First, the characteristics of the simulation apparatus 5 in the operation of registering the taught point will be explained in correspondence with the description of the appended claims, and then, the specific explanation will be made.

In the simulation apparatus 5, the display control unit 51 allows the display device 6 to display a teach dialog box 73 (window) as an example of a taught point setting window used when the position of the distal end of the virtual robot arm 10A shown in FIG. 17 is taught on a screen 71 (window) on which the virtual robot arm 10A shown in FIG. 16 is displayed. Thereby, compared to the case where work is performed while alternating between two windows in related art, the convenience is higher and work efficiency may be improved. As below, the specific explanation will be made.

As shown in FIG. 16, the user operates the input device 7 to place the pointer on the screen 71 on which the virtual robot arm 10A is displayed, and performs click operation.

Thereby, the receiving unit 53 of the simulation apparatus 5 receives the operation instruction by the user and the display control unit 51 controls the display device 6 to display a context menu 72 on the screen 71 on which the virtual robot arm 10A is displayed.

Then, the user operates the input device 7 to press a teach button 721 of the context menu 72.

Thereby, the receiving unit 53 receives the operation instruction by the user and the display control unit 51 controls the display device 6 to display the teach dialog box 73 shown in FIG. 17 in place of the context menu 72 on the screen 71 on which the virtual robot arm 10A is displayed.

Then, the user operates the input device 7 to press a teach button 731 of the teach dialog box 73.

Thereby, the receiving unit 53 receives the operation instruction by the user and the simulation apparatus 5 stores the taught point in the memory unit 52. In the above described manner, the taught point is registered.

Note that the teach dialog box 73 is also displayed when the user operates the input device 7 to press a teach button 83 of the tool bar 81 shown in FIG. 11.

As described above, in the simulation apparatus 5, the attitude of the virtual robot arm 10A may be changed easily and promptly and, as a result, teaching data of the robot arm 10 (robot 1) may be created offline easily and promptly. That is, teaching, specifically, rough teaching may be performed on the robot arm 10 (robot 1) offline easily and promptly.

Second Embodiment

Figure 18:
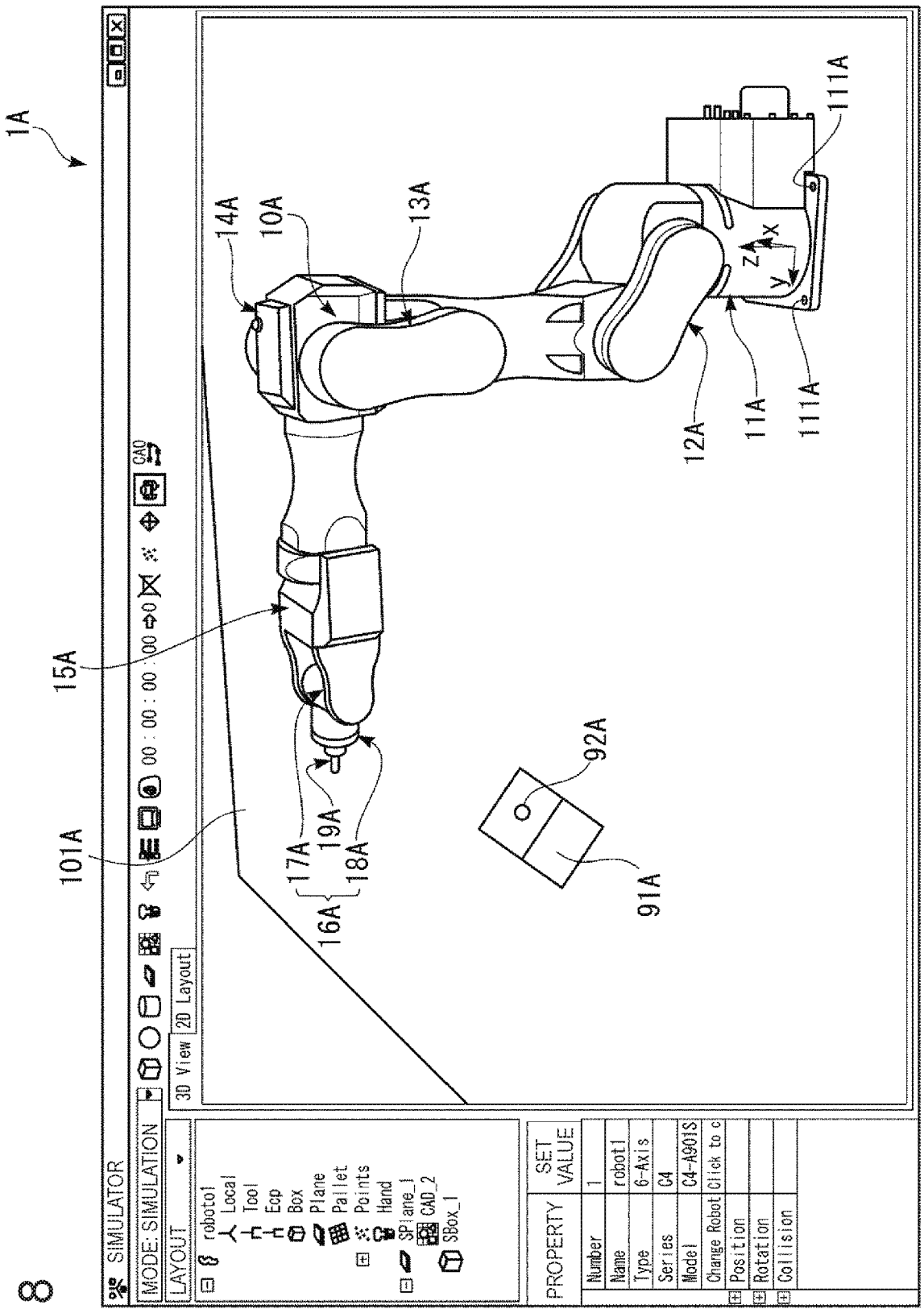
FIG. 18 is a diagram for explanation of a simulation in the second embodiment of the simulation apparatus according to the invention.

FIG. 18 is a diagram for explanation of a simulation in the second embodiment of the simulation apparatus according to the invention.

As below, the second embodiment will be explained with a focus on differences from the above described embodiment and the explanation of the same items will be omitted.

As shown in FIG. 18, in the simulation apparatus 5 of the second embodiment, when the receiving unit 53 receives an operation on a virtual object 91A, a position on the virtual object 91A can be set as a taught point of the virtual robot arm 10A. Thereby, teaching data with the taught point in the position on the virtual object 91A may be created easily and promptly. As below, the specific explanation will be made.

The user operates the input device 7 to press a Click to Point button (not shown) displayed on the display device 6.

Thereby, the receiving unit 53 of the simulation apparatus 5 receives the operation instruction by the user and the display control unit 51 sets the action mode to a Click to Point mode.

Then, the user operates the input device 7 to select a predetermined position (part) of the virtual object 91A displayed on the display device 6. In this case, the user operates the input device 7 to place the pointer in the predetermined position of the virtual object 91A and perform click operation.

Thereby, the receiving unit 53 receives the operation instruction by the user and the display control unit 51 controls the display device 6 to display a marker 92A in the position of the pointer. The marker 92A is not particularly limited, but, in the embodiment, has a spherical (small spherical) shape and is displayed in red, for example.

The operation may be performed on a single location of the virtual object 91A, on a plurality of locations on diverse positions of the virtual object 91A, or a plurality of virtual objects (not shown). The simulation apparatus 5 lists and stores the positions of the pointers when click operation is performed in the order selected by the user (the order of the click operation) in the memory unit 52. Thereby, the registration of the taught points is completed.

Then, the user operates the input device 7 to press an Export button (not shown) displayed on the display device 6.

Thereby, the receiving unit 53 receives the operation instruction by the user and the simulation apparatus 5 outputs position information listed and stored in the memory unit 52. That is, the display control unit 51 controls the display device 6 to display the position information listed and stored in the memory unit 52.

Further, the default values of the attitude of the tool, i.e., the attitude (rotation angle about x-axis, rotation angle about y-axis, rotation angle about z-axis) of a virtual end effector 19A attached to the virtual sixth arm 18A are (0,0,0), and the attitude of the virtual end effector 19A may be set to an attitude in the same orientation as the normal of CAD of a surface to which the position listed and stored in the memory unit 52 belongs, an attitude in the opposite orientation to the normal of CAD of the surface to which the position listed and stored in the memory unit 52 belongs, a current attitude of the virtual end effector 19A of the virtual robot arm 10A, or the like. Further, the attitude of the virtual end effector 19A may be adjusted by respectively changing the rotation angle about the x-axis, the rotation angle about the y-axis, the rotation angle about the z-axis from the default values.

According to the above described second embodiment, the same advantages as those of the above described embodiment may be offered.

Third Embodiment

Figure 19:
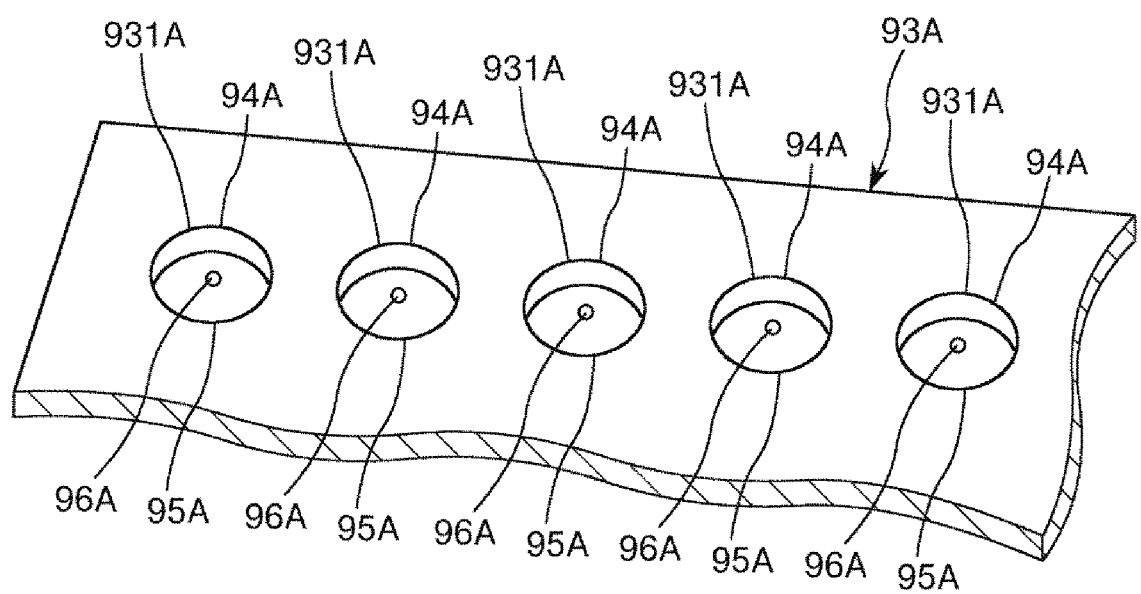
FIG. 19 is a diagram for explanation of a simulation in the third embodiment of the simulation apparatus according to the invention.
Figure 20:
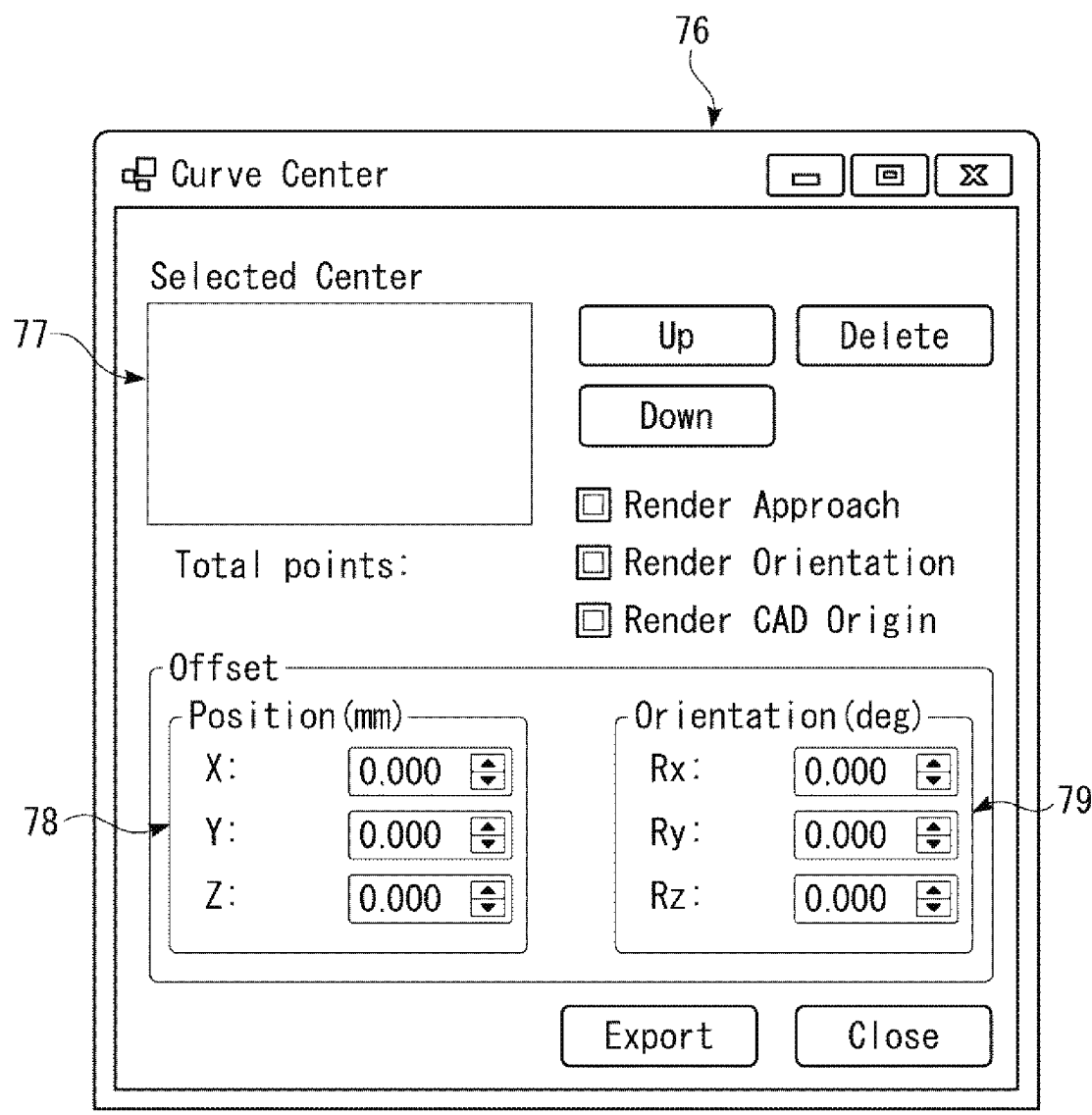
FIG. 20 shows a Curve Center dialog box displayed on the display device.
Figure 21:
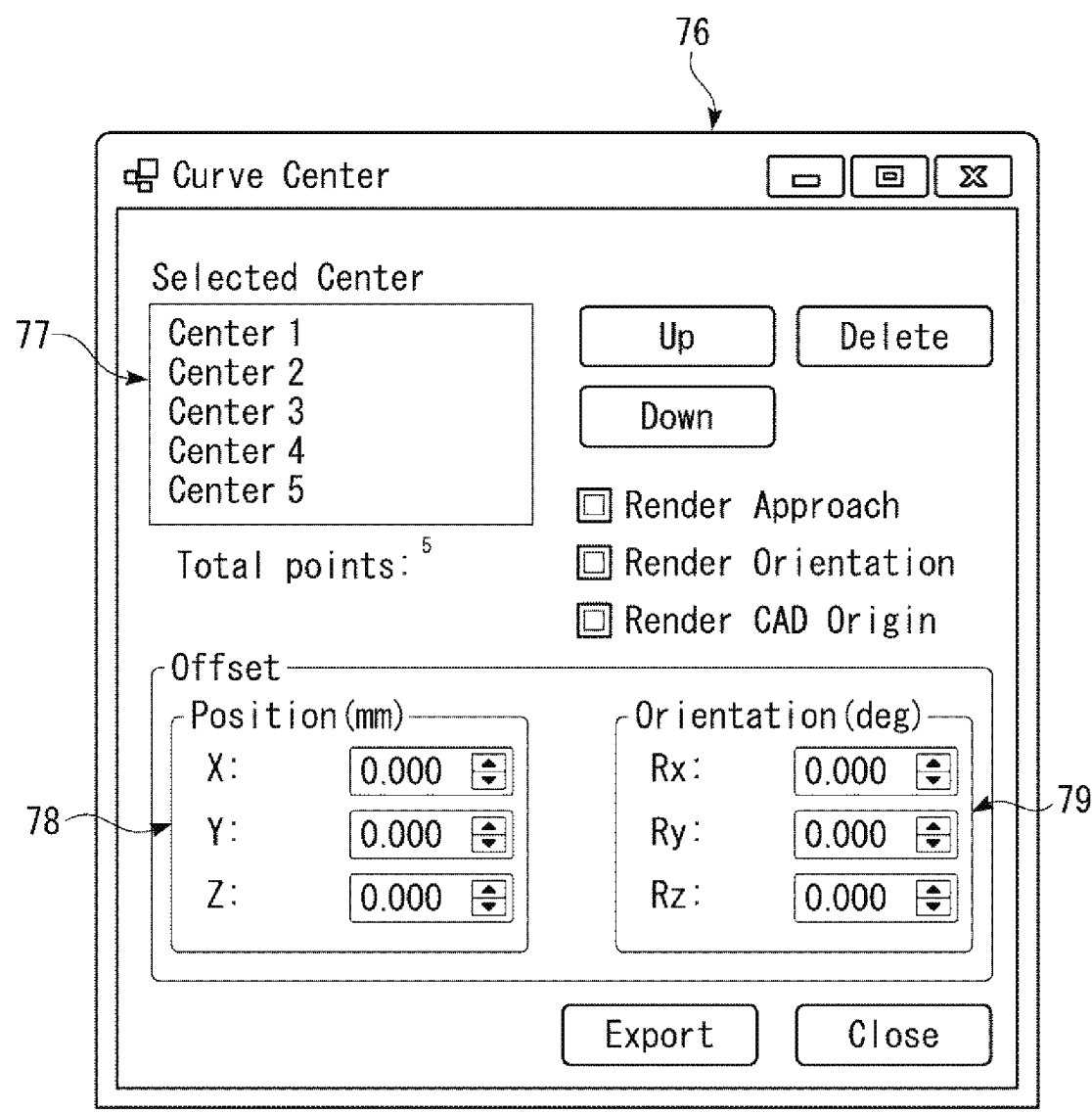
FIG. 21 shows the Curve Center dialog box displayed on the display device.

FIG. 19 is a diagram for explanation of a simulation in the third embodiment of the simulation apparatus according to the invention. FIGS. 20 and 21 respectively show a Curve Center dialog box displayed on the display device.

As below, the third embodiment will be explained with a focus on differences from the above described embodiment and the explanation of the same items will be omitted.

As shown in FIG. 19, in the simulation apparatus 5 of the third embodiment, when the receiving unit 53 receives a selection of a line segment 94A (an edge of a virtual hole 931A) contained in a virtual object 93A, the center of gravity (center) of a FIG. 95A (a circle defied by the edge of the virtual hole 931A) containing the line segment 94A can be set as a taught point of the virtual robot arm 10A. Thereby, teaching data with the taught point in the position of the center of gravity of the FIG. 95A containing the line segment 94A may be created easily and promptly.

The shape of the FIG. 95A is a circle in the embodiment, however, not limited to that. For example, a polygonal shape including a quadrangular shape such as rectangle or square, pentagonal shape, hexagonal shape, and an elliptic shape, etc. may be employed.

In the embodiment, the FIG. 95A is the circle defined by the edge of the virtual hole 931A, and the line segment 94A is an arc. In the simulation apparatus 5, when the line segment 94A is an arc (a circle or a part of a circle), the center of the arc can be set as a taught point of the virtual robot arm 10A. Thereby, teaching data with the taught point in the position of the center of the arc contained in the virtual object 93A may be created easily and promptly. Thus, for example, teaching data of work including actions to align mutual center axes such as screw fastening, screw fastening at multiple points, and application and injection of grease may be created easily and promptly.

The arc includes not only complete arcs having fixed curvatures but also arcs having curvatures within a range of a predetermined error (e.g. 5%). As below, the specific explanation will be made.

The user operates the input device 7 to press a Curve Center button (not shown) displayed on the display device 6.

Thereby, the receiving unit 53 of the simulation apparatus 5 receives the operation instruction by the user and the display control unit 51 controls the display device 6 to display a Curve Center dialog box 76 shown in FIG. 20.

As shown in FIG. 19, the virtual object 93A is displayed on the screen (3D screen) of the display device 6. In the embodiment, the virtual object 93A is a plate body having five (a plurality of) virtual holes 931A. Further, in the embodiment, the shape of each virtual hole 931A is a circular shape in the plan view of the virtual object 93A.

In this case, the edge of the virtual hole 931A of the embodiment corresponds to the line segment 94A. Therefore, in the embodiment, the line segment 94A is an arc (circle). Further, the figure defined by the edge of the virtual hole 931A corresponds to the FIG. 95A. Therefore, in the embodiment, the FIG. 95A is a circle. Furthermore, the center of the virtual hole 931A respectively corresponds to the center of gravity of the FIG. 95A and the center of the arc (circle).

Note that, in the embodiment, the shape of the virtual object 93A is the circular shape in the plan view of the virtual object 93A, however, not limited to that. For example, a polygonal shape including a quadrangular shape such as rectangle or square, pentagonal shape, hexagonal shape, and an elliptic shape, etc. may be employed.

Then, the user operates the input device 7 to select the edges of the respective virtual holes 931A of the virtual object 93A on the 3D screen displayed on the display device 6. In this case, the user operates the input device 7 to place the pointer in the position of the edges of the respective virtual holes 931A of the virtual object 93A and perform click operation, and move the pointer along the edges.

Thereby, the receiving unit 53 receives the operation instruction by the user and the display control unit 51 controls the display device 6 to display markers 96A at the centers (centers of gravity) of the respective virtual holes 931A. The markers 96A are not particularly limited, but, in the embodiment, have spherical (small spherical) shapes and are displayed in red, for example.

Further, the simulation apparatus 5 lists and stores the positions of the centers of the respective virtual holes 931A in the order of selection by the user in the memory unit 52. Thereby, the registration of the taught points is completed. The display control unit 51 controls the display device 6 to display the list of the taught points that have been completely registered as "Center 1", "Center 2", "Center 3", "Center 4", "Center 5" in the text box 77 as shown in FIG. 21.

Here, the positions of the centers of the respective virtual holes 931A may be changed (corrected) by inputting and setting an offset value in a predetermined direction of the x-axis direction, y-axis direction, z-axis direction in Position (mm) 78 of the Curve Center dialog box 76.

Further, in Orientation (Rotation) (deg) 79 of the Curve Center dialog box 76, a predetermined offset value of the rotation angle about the x-axis, the rotation angle about the y-axis, the rotation angle about the z-axis is input and set, and thereby, the attitude of the tool, i.e., the attitude of the virtual end effector 19A attached to the virtual sixth arm 18A (see FIG. 18) may be changed (corrected).

According to the third embodiment, the same advantages as those of the above described embodiments may be offered.

As above, the simulation apparatus, the control apparatus, and the robot according to the invention are explained according to the illustrated embodiments, however, the invention is not limited to those and the configurations of the respective parts may be replaced by arbitrary configurations having the same functions. Further, other arbitrary configurations may be added.

Furthermore, the invention may include a combination of two or more arbitrary configurations (features) of the above described respective embodiments.

In the above described embodiments, the location to which the base of the robot is fixed is the floor in the installation space, however, not limited to that in the invention. In addition, e.g. a ceiling, wall, workbench, the ground, etc. may be employed.

In the invention, the robot may be installed within a cell. In this case, the location to which the base of the robot is fixed includes e.g. a floor part, ceiling part, and wall part of the cell, and a workbench.

In the above described embodiments, the first surface as a plane (surface) to which the robot (base) is fixed is a plane (surface) parallel to the horizontal plane, however, not limited to that in the invention. For example, the first surface may be a plane (surface) inclined with respect to the horizontal plane or vertical plane or a plane (surface) parallel to the vertical plane. That is, the first rotation axis may be inclined with respect to the vertical direction or horizontal direction or parallel to the horizontal direction.

Further, in the above described embodiments, the number of rotation axes of the robot arm of the robot is six, however, not limited to that in the invention. The number of rotation axes of the robot arm may be e.g. two, three, four, five, or seven or more. That is, in the above described embodiments, the number of arms (links) is six, however, not limited to that in the invention. The number of arms may be e.g. two, three, four, five, or seven or more. In this case, for example, in the robot of the above described embodiments, a robot having seven arms may be realized by addition of an arm between the second arm and the third arm.

Furthermore, in the above described embodiments, the number of robot arms is one, however, not limited to that in the invention. The number of robot arms may be e.g. two or more. That is, the robot (robot main body) may be e.g. a multi-arm robot including a dual-arm robot.

In the invention, the robot may be another type of robot. Specific examples include e.g. a legged walking (running) robot having leg parts and a horizontal articulated robot such as a scalar robot. The horizontal articulated robot refers to a robot having an arm (except a spline shaft) acting in the horizontal direction.

Further, in the above described embodiments, the robot control apparatus and the simulation apparatus are separate apparatuses, however, not limited to those in the invention. For example, one of the robot control apparatus and the simulation apparatus may have the function of the other.

The entire disclosure of Japanese Patent Application No. 2017-080734, filed Apr. 14, 2017 is expressly incorporated by reference herein.

What is claimed is:

1. A simulation apparatus comprising:
a display configured to display a virtual base, a first virtual arm, and a second virtual arm as a three-dimensional image corresponding to a base, a first arm connected to the base, and a second arm connected to the first arm of a robot, respectively, the second arm being located far from the base than the first arm, an end effector being attachable to an end of the second arm;
an input interface configured to receive an operation of a user;
a memory configured to store computer-executable instructions, image data of a plurality of attitudes of the first and second arms of the robot, and a robot three-dimensional coordinate system; and
a processor configured to execute the computer-executable instructions so as to:
receive a selection input from the user via the input interface to indicate selecting the second arm of the robot to be virtually operated;

display the virtual base, the first virtual arm, and the second virtual arm of the robot on the display as the three-dimensional image based on the image data and the robot three-dimensional coordinate system;

change a color of the displayed second virtual arm to a first color that is different from a color of the displayed first virtual arm of the robot on the display based on the received selection input and the robot three-dimensional coordinate system;

receive a drag operation with respect to the selected second arm from the user via the input interface;

display a horizontal mesh at a display position of the displayed second virtual arm based on the robot three-dimensional coordinate system, the displayed horizontal mesh moving along with the displayed second virtual arm;

change an attitude of the displayed first and second virtual arms to cause the end of the displayed second virtual arm to reach a target position in response to the drag operation and based on the robot three-dimensional coordinate system; and change the first color of the displayed second virtual arm to a second color when the changed attitude of the displayed first and second virtual arms is an impossible attitude of the first and second arms of the robot by the received drag operation and based on the robot three-dimensional coordinate system.

2. The simulation apparatus according to claim 1,
wherein the virtual arm has three or more of the virtual arms corresponding to three or more of the arms of the robot, and
the processor is further configured to:
receive the selection input from the user via the input interface to indicate selecting one of the three or more of the arms of the robot to be virtually operated; and
display one of the three or more of the virtual arms of the robot corresponding to the selected one of the three or more of the arms on the display in the first color as the selected arm based on the image data and the robot three-dimensional coordinate system.

3. The simulation apparatus according to claim 1,
wherein, when the processor receives an instruction to fix a position of a distal end of the displayed second virtual arm from the user via the input interface, the processor is configured to change the attitude of the displayed second virtual arm while the distal end of the displayed second virtual arm is fixed.

4. The simulation apparatus according to claim 1,
wherein, when the processor receives the operation on a virtual object from the user via the input interface, the processor is configured to set a position on the virtual object as a teaching point of the displayed first and second virtual arms.

5. The simulation apparatus according to claim 1,
wherein, when the processor receives a selection of a line segment contained in a virtual object from the user via the input interface, the processor is configured to set a center of gravity of a figure containing the line segment in the virtual object as a teaching point of the displayed first and second virtual arms.

6. The simulation apparatus according to claim 5,
wherein, when the line segment is an arc as the figure, the processor is configured to set a center of the arc as a teaching point of the displayed first and second virtual arms.

7. The simulation apparatus according to claim 1,
wherein the display includes the input interface,
wherein the processor allows the display to display a teaching point setting window, and
the processor is configured to receive a teaching point setting input from the user via the teaching point setting window on the display.

8. The simulation apparatus according to claim 1,
wherein the display includes the input interface.

9. A robot control apparatus comprising:
a robot having a base, a first arm connected to the base, and a second arm connected to the first arm, the second arm being located far from the base than the first arm, an end effector being attachable to an end of the second arm;
a display configured to display a virtual base, a first virtual arm, and a second virtual arm as a three-dimensional image corresponding to the base, the first arm, and the second arm of the robot;
an input interface configured to receive an operation of a user;
a memory configured to store computer-executable instructions image data of a plurality of attitudes of the first and second arms of the robot, and a robot three-dimensional coordinate system; and
a processor configured to execute the computer-executable instructions so as to:
receive a selection input from the user via the input interface to indicate selecting the second arm of the robot to be virtually operated;
display the virtual base, the first virtual arm, and the second virtual arm of the robot on the display as the three-dimensional image based on the image data and the robot three-dimensional coordinate system;
change a color of the displayed second virtual arm to a first color that is different from a color of the displayed first virtual arm of the robot on the display based on the received selection input and the robot three-dimensional coordinate system;
receive a drag operation with respect to the selected second arm from the user via the input interface;
display a horizontal mesh at a display position of the displayed second virtual arm based on the robot three-dimensional coordinate system, the displayed horizontal mesh moving along with the displayed second virtual arm;
change an attitude of the displayed first and second virtual arms to cause the end of the displayed second virtual arm to reach a target position in response to the drag operation and based on the robot three-dimensional coordinate system; and
change the first color of the displayed second virtual arm to a second color when the changed attitude of the displayed first and second virtual arms is an impossible attitude of the arm first and second arms of the robot by the received drag operation and based on the robot three-dimensional coordinate system.

10. The robot control apparatus according to claim 9,
wherein the virtual arm has a three or more of the virtual arms corresponding to a three or more of the arms of the robot, and
the processor is further configured to:
receive the selection input from the user via the input interface to indicate selecting one of the three or more of the arms of the robot to be virtually operated; and display one of the three or more of the virtual arms of the robot corresponding to the selected one of the three or more of the arms on the display in the first color as the selected arm based on the image data and the robot three-dimensional coordinate system.

11. The robot control apparatus according to claim 9, wherein, when the processor receives an instruction to fix a position of a distal end of the displayed second virtual arm from the user via the input interface, the processor is configured to change the attitude of the displayed second virtual arm while the distal end of the displayed second virtual arm is fixed.

12. The robot control apparatus according to claim 9, wherein, when the processor receives the operation on a virtual object from the user via the input interface, the processor is configured to set a position on the virtual object as a teaching point of the displayed first and second virtual arms.

13. The robot control apparatus according to claim 9, wherein, when the processor receives a selection of a line segment contained in a virtual object from the user via the input interface, the processor is configured to set a center of gravity of a figure containing the line segment as a teaching point of the displayed first and second virtual arms.

14. The robot control apparatus according to claim 13, wherein, when the line segment is an arc as the figure, the processor is configured to set a center of the arc as a teaching point of the displayed first and second virtual arms.

15. The robot control apparatus according to claim 9, wherein the display includes the input interface, wherein the processor allows the display to display a teaching point setting window, and the processor is configured to receive a teaching point setting input from the user via the teaching point setting window on the display.

16. The robot control apparatus according to claim 9, wherein the display includes the input interface.

\* \* \* \* \*